United States Patent
Yang et al.

(10) Patent No.: US 11,456,236 B2
(45) Date of Patent: Sep. 27, 2022

(54) VERTICAL SEMICONDUCTOR DEVICES INCLUDING VERTICAL MEMORY CELLS AND PERIPHERAL CIRCUITS UNDER THE VERTICAL MEMORY CELLS

(71) Applicant: Samsung Electronics Co., Ltd., Suwon-si (KR)

(72) Inventors: Woo-Sung Yang, Gwangmyeong-si (KR); Joon-Sung Lim, Seognam-si (KR); Sung-Min Hwang, Hwaseong-si (KR); Ji-Young Kim, Hwaseong-si (KR); Ji-Won Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/722,418

(22) Filed: Dec. 20, 2019

(65) Prior Publication Data

US 2020/0303284 A1 Sep. 24, 2020

(30) Foreign Application Priority Data

Mar. 20, 2019 (KR) .......................... 10-2019-0031814

(51) Int. Cl.
*H01L 23/48* (2006.01)
*H01L 27/11582* (2017.01)
*H01L 27/11575* (2017.01)

(52) U.S. Cl.
CPC ...... *H01L 23/481* (2013.01); *H01L 27/11575* (2013.01); *H01L 27/11582* (2013.01)

(58) Field of Classification Search
CPC ......... H01L 27/11524; H01L 27/11529; H01L 27/11531; H01L 27/11556; H01L 27/1157; H01L 27/11573; H01L 27/11575; H01L 27/11582; H01L 23/481; H01L 25/0657; H01L 27/11548; H01L 21/76898
USPC ....................................... 257/314
See application file for complete search history.

(56) References Cited

U.S. PATENT DOCUMENTS

| | | | |
|---|---|---|---|
| 6,204,564 B1 * | 3/2001 | Miyata | H01L 24/97 257/778 |
| 6,426,554 B1 * | 7/2002 | Egawa | H01L 21/568 257/666 |
| 8,139,387 B2 | 3/2012 | Park et al. | |
| 9,111,592 B2 | 8/2015 | Maejima | |
| 9,240,405 B2 | 1/2016 | Chen et al. | |
| 9,337,198 B2 | 5/2016 | Kwon et al. | |
| 10,074,667 B1 | 9/2018 | Higashi et al. | |
| 10,090,315 B2 | 10/2018 | Fukuzumi et al. | |

(Continued)

FOREIGN PATENT DOCUMENTS

JP 2011-204829 A 10/2011

*Primary Examiner* — Khiem D Nguyen
(74) *Attorney, Agent, or Firm* — Harness, Dickey & Pierce, P.L.C.

(57) ABSTRACT

A vertical semiconductor device including a plurality of vertical memory cells on an upper surface of a first substrate, an adhesive layer on a lower surface of the first substrate that is opposite to the upper surface of the first substrate, a second substrate having first peripheral circuits thereon, a lower insulating interlayer on the second substrate, and a plurality of wiring structures electrically connecting the vertical memory cells and the first peripheral circuits. A lower surface of the adhesive layer and an upper surface of the lower insulating interlayer may be in contact with each other.

15 Claims, 38 Drawing Sheets

(56) References Cited

U.S. PATENT DOCUMENTS

| | | | |
|---|---|---|---|
| 2010/0320526 A1* | 12/2010 | Kidoh | H01L 27/11582 257/324 |
| 2011/0309432 A1* | 12/2011 | Ishihara | H01L 27/11582 257/324 |
| 2012/0199984 A1* | 8/2012 | Fujita | H01L 23/481 257/774 |
| 2013/0017629 A1* | 1/2013 | Pyo | H01L 27/11551 438/16 |
| 2014/0145318 A1* | 5/2014 | Otremba | H01L 23/49503 257/670 |
| 2015/0129878 A1* | 5/2015 | Shin | H01L 27/11556 257/66 |
| 2015/0325588 A1* | 11/2015 | Lee | H01L 27/11568 257/329 |
| 2015/0372005 A1* | 12/2015 | Yon | H01L 27/2436 257/5 |
| 2016/0307910 A1* | 10/2016 | Son | H01L 27/11573 |
| 2017/0047343 A1* | 2/2017 | Lee | H01L 27/11529 |
| 2017/0373084 A1* | 12/2017 | Shim | H01L 23/528 |
| 2018/0254247 A1* | 9/2018 | Kim | H01L 23/5226 |
| 2018/0261575 A1* | 9/2018 | Tagami | H01L 25/50 |
| 2018/0277497 A1 | 9/2018 | Matsuo | |
| 2019/0189576 A1* | 6/2019 | Das | H01L 24/11 |
| 2020/0194452 A1* | 6/2020 | Xiao | H01L 27/1157 |
| 2020/0258857 A1* | 8/2020 | Huo | H01L 27/11548 |

* cited by examiner

VERTICAL SEMICONDUCTOR DEVICES INCLUDING VERTICAL MEMORY CELLS AND PERIPHERAL CIRCUITS UNDER THE VERTICAL MEMORY CELLS

CROSS-REFERENCE TO RELATED APPLICATION

This application claims priority under 35 USC § 119 to Korean Patent Application No. 10-2019-0031814, filed on Mar. 20, 2019, in the Korean Intellectual Property Office (KIPO), the contents of which are incorporated by reference herein in their entirety.

BACKGROUND

1. Field

Some example embodiments relate to vertical semiconductor devices and/or methods of manufacturing the same.

2. Description of the Related Art

As a device is highly integrated, a vertical-NAND (VNAND) flash memory device may have a cell on peripheral (COP) structure in which vertical memory cells is formed on the peripheral circuits on a substrate. In this case, the peripheral circuits may be deteriorated during forming the vertical memory cells. Therefore, the VNAND flash memory device may experience failures of operation or deterioration of characteristics.

SUMMARY

Some example embodiments provide vertical semiconductor devices having excellent electrical characteristics.

Some example embodiments provide methods of manufacturing a vertical semiconductor device having improved electrical characteristics.

According to an example embodiment, a vertical semiconductor device may include a plurality of vertical memory cells on an upper surface of a first substrate, an adhesive layer on a lower surface of the first substrate that is opposite to the upper surface of the first substrate, a second substrate having first peripheral circuits thereon, a lower insulating interlayer on the second substrate, and a plurality of wiring structures electrically connecting the vertical memory cells and the first peripheral circuits. A lower surface of the adhesive layer and an upper surface of the lower insulating interlayer may be in contact with each other.

According to an example embodiment, a vertical semiconductor device may include a plurality of vertical memory cells on an upper surface of a first substrate, a first insulating interlayer covering the vertical memory cells on the first substrate, an adhesive layer on a lower surface of the first substrate that is opposite to the upper surface of the first substrate, a second substrate having peripheral circuits thereon, a lower insulating interlayer covering the peripheral circuits on the second substrate, an upper surface of the lower insulating interlayer in contact with a lower surface of the adhesive layer, and a plurality of through via contacts passing through at least the first insulating interlayer, each of the through via contacts in contact with a lower wiring of a corresponding one of the peripheral circuits.

According to an example embodiment, a vertical semiconductor device may include a plurality of vertical memory cells on an upper surface of a first substrate, an adhesive layer on a lower surface of the first substrate that is opposite to the upper surface of the first substrate, peripheral circuits on a second substrate, and a lower insulating interlayer covering the peripheral circuits on the second substrate, an upper surface of the lower insulating interlayer in contact with a lower surface of the adhesive layer. The first substrate may overlap an upper surface of the second substrate, and the adhesive layer and the lower insulating interlayer may be between the first and second substrates.

According to an example embodiment, a method of manufacturing a vertical semiconductor device may include forming a plurality of vertical memory cells on an upper surface of a first substrate, forming an adhesive layer on a lower surface of the first substrate that is opposite to the upper surface of the first substrate, forming peripheral circuits on a second substrate, forming a lower insulating interlayer on the second substrate, bonding a lower surface of the adhesive layer and an upper surface of the lower insulating interlayer to each other, and forming a plurality of wiring structures electrically connecting the vertical memory cells and the peripheral circuits.

In an example embodiment, the vertical semiconductor device may include vertical memory cells and the peripheral circuits on respective substrates so that each of the vertical memory cells and the peripheral circuits may have improved electrical characteristics. Thus, the vertical semiconductor device may have improved electrical characteristics.

BRIEF DESCRIPTION OF THE DRAWINGS

Example embodiments will be more clearly understood from the following detailed description taken in conjunction with the accompanying drawings.

FIG. 1 is a cross-sectional view illustrating a vertical semiconductor device in accordance with an example embodiment;

FIG. 2 is a cross-sectional view illustrating a vertical semiconductor device in accordance with some an example embodiment;

FIGS. 3 to 14 are plan views and cross-sectional views illustrating stages of a method of manufacturing a vertical semiconductor device in accordance with an example embodiment;

FIG. 15 is a cross-sectional view illustrating a vertical semiconductor device in accordance with an example embodiment;

FIG. 16 is a cross-sectional view illustrating a stage of a method of manufacturing a vertical semiconductor device including the lower conductive layer of FIG. 15, in accordance with an example embodiment;

FIG. 17 is a cross-sectional view illustrating a vertical semiconductor device in accordance with an example embodiment;

FIG. 18 is a cross-sectional view illustrating a vertical semiconductor device in accordance with an example embodiment;

FIGS. 19 to 21 are cross-sectional views illustrating stages of a method of manufacturing a vertical semiconductor device in accordance with an example embodiment;

FIG. 22 is a cross-sectional view illustrating a vertical semiconductor device in accordance with an example embodiment;

FIGS. 23 to 24 are plan views and cross-sectional views illustrating stages of a method of manufacturing a vertical semiconductor device in accordance with an example embodiment;

FIG. 25 is a cross-sectional view illustrating a vertical semiconductor device in accordance with an example embodiment;

FIG. 26 is a cross-sectional view illustrating stages of a method of manufacturing a vertical semiconductor device in accordance with an example embodiment;

FIG. 27 is a cross-sectional view illustrating a vertical semiconductor device in accordance with an example embodiment;

FIGS. 28 to 31 are plan views and cross-sectional views illustrating stages of a method of manufacturing a vertical semiconductor device in accordance with an example embodiment;

FIG. 32 is a cross-sectional view illustrating a vertical semiconductor device in accordance with an example embodiment;

FIG. 33 is a cross-sectional view illustrating a vertical semiconductor device in accordance with an example embodiment;

FIG. 34 is a cross-sectional view illustrating a vertical semiconductor device accordance with an example embodiment;

FIG. 35 is a cross-sectional view illustrating a vertical semiconductor device in accordance with an example embodiment;

FIG. 36 is a cross-sectional view illustrating a vertical semiconductor device in accordance with an example embodiment;

FIGS. 37 and 38 are cross-sectional views illustrating stages of a method of manufacturing a vertical semiconductor device in accordance with an example embodiment;

FIG. 39 is a cross-sectional view illustrating a vertical semiconductor device in accordance with an example embodiment; and FIG. 40 is a cross-sectional view illustrating a vertical semiconductor device in accordance with an example embodiment.

DETAILED DESCRIPTION

Example embodiments will be more clearly understood from the following detailed description taken in conjunction with the accompanying drawings.

Hereinafter, directions substantially parallel to an upper surface of a substrate are defined as a first direction and a second direction, respectively, and a direction substantially perpendicular to the upper surface of the substrate are defined as a vertical direction.

Figure 1:
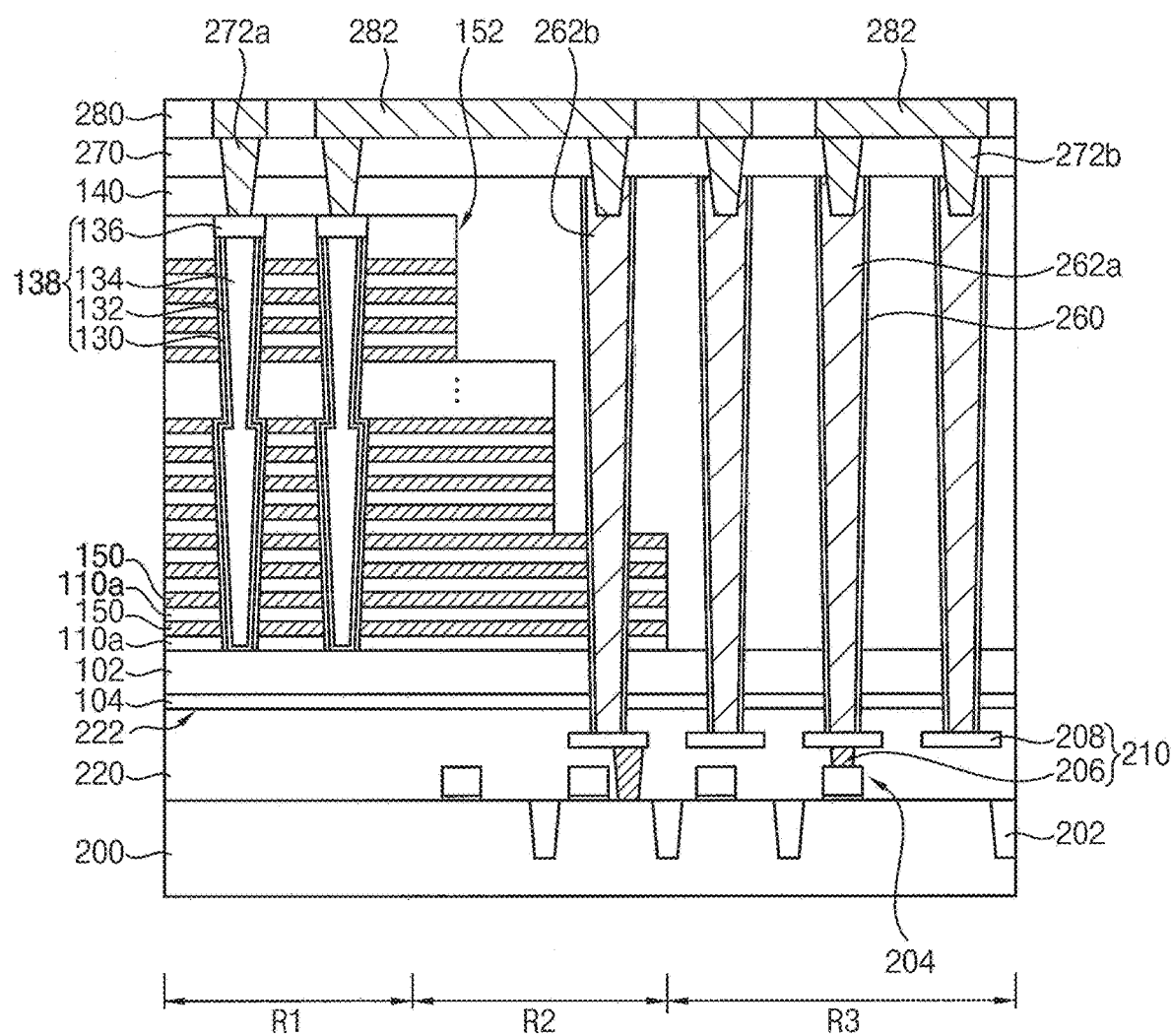
FIGS. 1 to 40 represent non-limiting, example embodiments as described herein.
Figure 2:
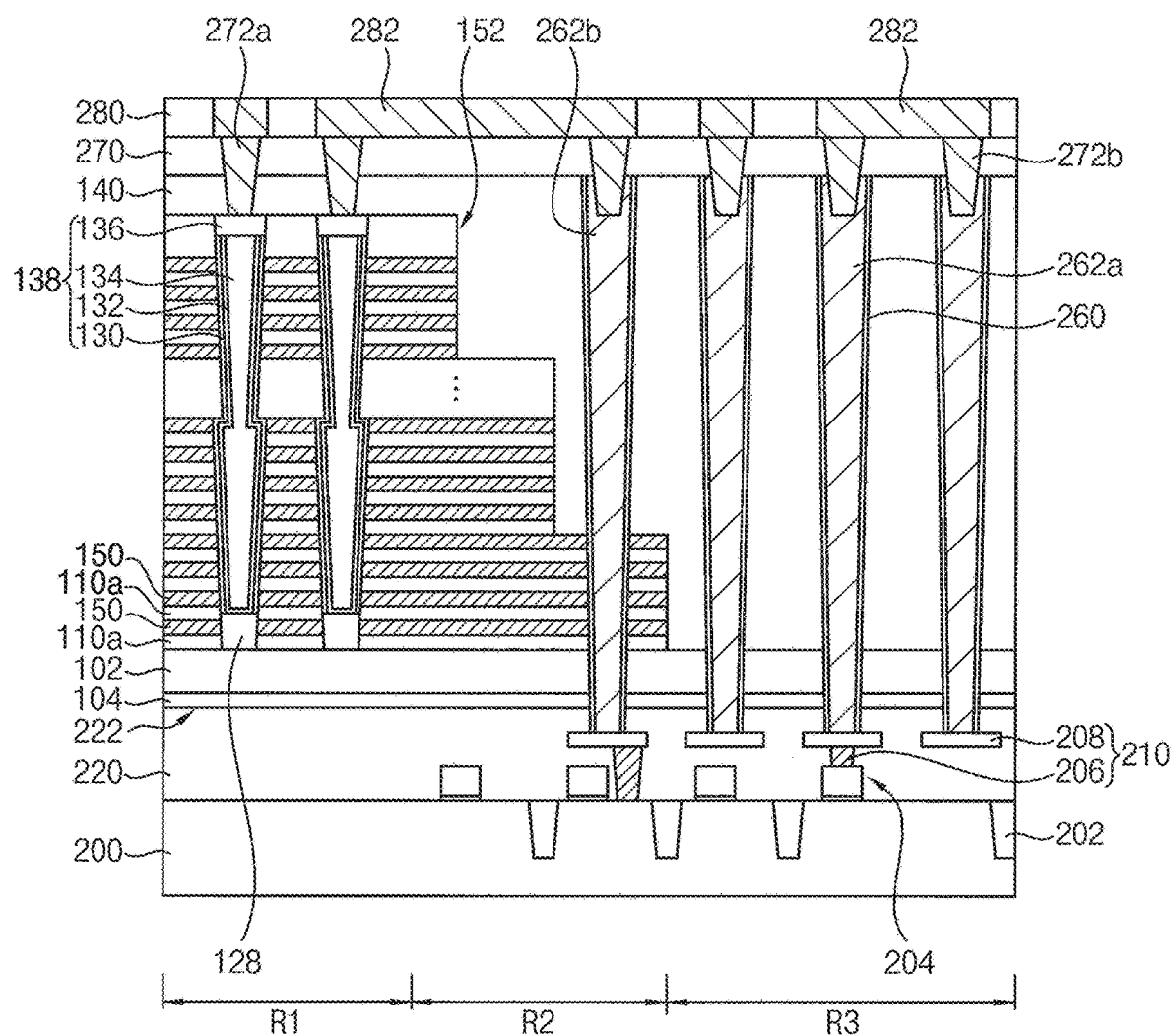

FIG. 1 is a cross-sectional view illustrating a vertical semiconductor device in accordance with an example embodiment. FIG. 2 is a cross-sectional view illustrating a vertical semiconductor device in accordance with some an example embodiment.

Referring to FIG. 1, the vertical semiconductor device may include a first substrate 102 on which vertical memory cells are formed, and a second substrate 200 on which peripheral circuits are formed. An adhesive layer 104 may be formed on a lower surface of the first substrate 102, and a lower insulating interlayer 220 may be formed on the second substrate 200. The adhesive layer 104 may bond the lower surface of the first substrate 102 and an upper surface of a lower insulating interlayer 220 to each other. Further, through via contacts 262a and 262b may be formed to be electrically connected with the vertical memory cells and the peripheral circuits. The through via contacts 262a and 262b may penetrate through the first substrate 102 and a first insulating interlayer 140 formed on the first substrate 102.

The first substrate 102 may include a single crystal semiconductor material (e.g., silicon, germanium, or silicon-germanium).

In some example embodiments, a thickness of the first substrate 102 may be about 0.1 μm to about 1 μm. The first substrate 102 may be obtained by grinding a lower surface of a bare substrate. The first substrate 102 may have the thickness less than a thickness of the second substrate 200.

A conductive pattern structure 152 may be formed on the first substrate 102. The conductive pattern structure 152 may include first insulation patterns 110a and first conductive patterns 150 repeatedly and alternately stacked.

The first conductive patterns 150 may include metal (e.g., tungsten, copper, or aluminum). The first conductive patterns 150 may serve as gate electrodes included in the vertical memory cells. In some example embodiments, the first conductive patterns 150 may extend in the first direction.

The conductive pattern structure 152 may extend in the first direction. An edge portion of the conductive pattern structure 152 may have a staircase shape. Portions of the first conductive patterns 150 having a staircase shape may serve as gate pads for connecting with wirings. Although not shown, contact plugs may be formed on the first conductive patterns 150 serving as the gate pads.

In some example embodiments, the edge portions of the conductive pattern structure 152 may have the staircase shape in the first direction and the second direction, respectively. For example, one stepped layer in the first direction may include a plurality of first insulation patterns 110a and a plurality of first conductive patterns 150. Further, one stepped layer in the second direction may include one of the first insulation patterns 110a and one of the first conductive patterns 150.

In some example embodiments, the edge portions of the conductive pattern structure 152 may have the staircase shape only in the first direction. In this case, one stepped layer may include one of the first insulation patterns 110a and one of the first conductive patterns 150.

A plurality channel holes 126 (refer to FIG. 6) may penetrate through the conductive pattern structure 152, and the channel holes 126 may expose an upper surface of the first substrate 102. A channel structure 138 may be formed in the channel holes 126, and the channel structure 138 may be electrically connected to the upper surface of the first substrate 102.

Figure 5:
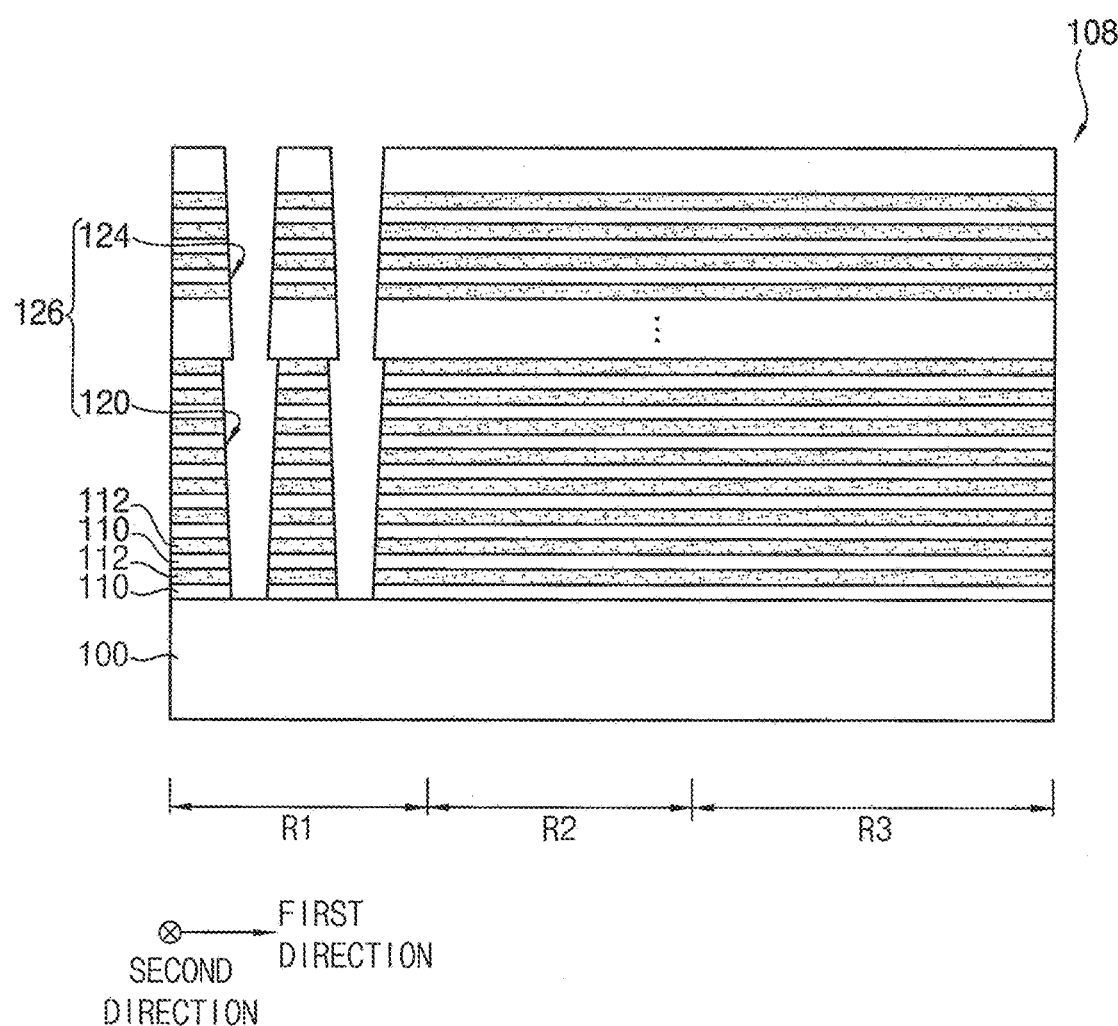

In some example embodiments, the channel hole 126 may include a lower channel hole 120 (refer to FIG. 5) and an upper channel hole 124 (refer to FIG. 5). A sidewall of each of the lower and upper channel holes 120 and 124 may be inclined such that a width of each of the lower and upper channel holes 120 and 124 becomes smaller in a downward direction. The sidewall of the channel hole 126 may be bent at a boundary between the upper channel hole 124 and the lower channel hole 120. A sidewall profile of the channel structure 138 may be the same as a sidewall profile of the channel hole 126.

In some example embodiments, although not shown, a sidewall of the channel hole 126 may be inclined such that a width of the channel hole 126 becomes smaller in a downward direction without a bent portion. In this case, a side wall of the channel structure 138 may have no bent portion.

In some example embodiments, the channel structure 138 may include a charge storage structure 130, a channel 132, a filling insulation pattern 134, and a capping pad pattern 136. Although not specifically illustrated, the charge storage structure 130 may include a tunnel insulation pattern, a charge storage pattern, and a blocking dielectric pattern.

In some example embodiments, the channel 132 may be electrically connected to the first substrate 102. The channel 132 may include polysilicon. The tunnel insulation pattern, the charge storage pattern, and the blocking dielectric pattern may be sequentially stacked on the channel 132.

The charge storage structure 130 may be formed on the sidewall of the channel hole 126. The blocking dielectric pattern of the charge storage structure 130 may contact the first conductive patterns 150 exposed by the channel holes 126.

In some example embodiments, the channel 132 may have a cylindrical shape, and the filling insulation pattern 134 may fill an inner space of the channel 132.

The capping pad pattern 136 may be formed on the channel 132 and the filling insulation pattern 134. The capping pad pattern 136 may include polysilicon. The capping pad pattern 136 may serve as pads for upper wirings 282.

In some example embodiments, the channel structure 138 may contact the upper surface of the first substrate 102 exposed by the channel hole 126. In this case, the channel 132 may contact the upper surface of the first substrate 102.

In some example embodiments, as shown in FIG. 2, a semiconductor pattern 128 may be further formed on the upper surface of the first substrate 102 exposed by the channel hole 126. The semiconductor pattern 128 may be formed by a selective epitaxial process. The semiconductor pattern 128 may include single crystal silicon. In this case, the channel structure 138 may be formed on the semiconductor pattern 128. Further, the channel 132 may contact the semiconductor pattern 128.

In some example embodiments described below, when the first substrate includes a single crystal semiconductor, for example, single crystal silicon, the semiconductor pattern 128 may be further formed on a bottom of each of the channel holes 126.

The first insulating interlayer 140 may be formed on the first substrate 102 to cover the conductive pattern structure 152. The first insulating interlayer 140 may include, for example, silicon oxide. An upper surface of the first insulating interlayer 140 may be flat.

As described above, the vertical memory cells including the conductive pattern structure 152 and the channel structure 138 may be formed on the first substrate 102.

Although an example of the vertical memory cells is described above, a structure and a shape of the vertical memory cells formed on the first substrate 102 may not be limited thereto.

The first substrate 102 includes a first region R1 in which the vertical memory cells are formed, a second region R2 in which the gate pad is formed, and a third region R3 of a region disposed at a lateral direction of the gate pad region.

The adhesive layer 104 may be formed on the lower surface of the first substrate 102. The adhesive layer 104 may serve as a layer for bonding the first and second substrates 102 and 200 to each other. The adhesive layer 104 may include an insulation material. The adhesive layer 104 may include a silicon compound. In some example embodiments, the adhesive layer 104 may include a compound containing silicon (e.g., silicon oxide ($SiO_2$), SiCN, SiOC, SiC or a combination thereof). In some example embodiments, the adhesive layer 104 may include at least one of Ga, GaN, copper, or a combination thereof.

The second substrate 200 may include a single crystal semiconductor material, for example, silicon, germanium, silicon-germanium, or III-V semiconductor compounds (e.g., GaP, GaAs, or GaSb). In some example embodiments, the second substrate 200 may be a silicon-on-insulator (SOI) substrate or a germanium-on-insulator (GOI) substrate.

Circuit patterns constituting peripheral circuits may be formed on the second substrate 200, and the lower insulating interlayer 220 may be formed to cover the circuit patterns.

A first isolation pattern 202 may be formed at an upper portion of the second substrate 200. Thus, the second substrate 200 may be divided into an active region and a field region. The circuit patterns may include first transistors 204 and lower wirings 210. Each of the first transistors 204 may include a gate structure and impurity regions. The lower wirings 210 may include lower contact plugs 206 and lower pad patterns 208. For example, the lower contact plug 206 may contact the gate structure and/or the impurity region. Further, at least one of the lower pad patterns 208 may serve as a pad pattern electrically connected to the lower contact plugs 206.

At least one of the lower pad patterns 208 may serve as a pad pattern electrically connected to the vertical memory cells formed on the first substrate 102. For example, the lower pad patterns 208 may be formed at an upper portion over the second substrate 200.

Although not shown, the lower contact plugs 206 and the lower pad patterns 208 may be formed in multiple stacked layers.

The lower insulating interlayer 220 may include silicon oxide. An upper surface of the lower insulating interlayer 220 may be flat.

The adhesive layer 104 disposed on the lower surface of the first substrate 102 may be formed on the lower insulating interlayer 220. Thus, the first and second substrates 102 and 200 may overlap while being spaced apart from each other in the vertical direction. The first and second substrates 102 and 200 may be bonded to each other, and the adhesive layer 104 and the lower insulating interlayer 220 may be interposed therebetween.

The upper surface of the lower insulating interlayer 220 and the lower surface of the adhesive layer 104 may be a bonding interface 222. In some example embodiments, voids may be irregularly generated at the bonding interface 222.

In some example embodiments, at least some of the lower pad patterns 208 may be provided on the second region R2 and the third region R3. For example, the lower pad patterns 208 may not be provided on the first region R1.

In some example embodiments, at least some of the lower pad patterns 208 may be provided on the third region R3. For example, the lower pad pattern 208 may not be provided on the first and second regions R1 and R2.

First and second through via contacts 262a and 262b may be formed through the first insulating interlayer 140 on the second and third regions R2 and R3 and the first substrate 102, so that the first and second through via contacts 262a and 262b may contact upper surfaces of corresponding ones of the lower pad patterns 208.

In some example embodiments, the first through via contacts 262a may pass through the first insulating interlayer 140, the first substrate 102, the adhesive layer 104, the lower insulating interlayer 220 on the third region R3, so that the first through via contacts 262a may contact corresponding ones of the lower pad patterns 208. The second through via contacts 262b may pass through the first insulating interlayer 140, portions of the conductive pattern structure 152 having the staircase shape, the first substrate 102 on the second region R2, so that the second through via contacts 262b may contact corresponding ones of the lower pad patterns 208.

The first and second through via contacts 262a and 262b may include metal (e.g., tungsten, copper, or aluminum). Although not shown, the first and second through via contacts 262a and 262b may include a barrier metal pattern and/or a metal pattern.

An insulation spacer 260 may surround outer walls of the first and second through via contacts 262a and 262b. The insulation spacer 260 may include silicon nitride or silicon oxide.

Thus, the first and second through via contacts 262a and 262b may be formed through the first substrate 102, so that the first and second through via contacts 262a and 262b may contact corresponding ones of the lower pad patterns 208 formed on the second substrate 200.

The first through via contact 262a and the first substrate 102 may be insulated from each other by the insulation spacer 260, and the second through via contact 262b, the first substrate 102 and the first conductive patterns 150 may be insulated from each other by the insulation spacer 260. That is, the first and second through via contacts 262a and 262b may not directly contact the vertical memory cells.

A second insulating interlayer 270 may be formed on the first insulating interlayer 140, and first and second upper contacts 272a and 272b may pass through the second insulating interlayer 270 and the first insulating interlayer 140.

The first upper contacts 272a may be formed through the second insulating interlayer 270 and the first insulating interlayer 140, so that the first upper contacts 272a may contact the capping pad pattern 136 included in the channel structure 138. The second upper contacts 272b may be formed through the second insulating interlayer 270, so that the second upper contacts 272b may contact the first and second through via contacts 262a and 262b.

A third insulating interlayer 280 may be formed on the second insulating interlayer 270 and the first and second upper contacts 272a and 272b, and the upper wirings 282 connected to the first and second upper contacts 272a and 272b may be formed in the third insulating interlayer 280.

The upper wirings 282 may connect the vertical memory cells and the first and second through via contacts 262a, 262b to each other. Thus, the vertical memory cells formed on the first substrate 102 and the peripheral circuits formed on the second substrate 200 may be electrically connected to each other. In other words, a plurality of wiring structures, each of which includes (1) one of a plurality of through via contacts 262a and 262b passing through the first insulating interlayer 140 and the first substrate 102, and contacting a lower wiring 210 of a corresponding one of the first peripheral circuits, and (2) the upper wiring 282 electrically connected to the one of the through via contacts 262a and 262b, may electrically connect (1) the vertical memory cells formed on the first substrate 102 and (2) the peripheral circuits formed on the second substrate 200 and including the first transistors 204 and the lower wirings 210.

In some example embodiments, the capping pad pattern 136 and the peripheral circuits can be electrically connected by the upper wiring 282. In some example embodiments, the first conductive pattern 150 included in the vertical memory cells and the peripheral circuits may be electrically connected by the upper wiring 282.

In some example embodiments, some of the upper wiring 282 may connect a plurality of through via contacts 262a, 262b to each other so that the peripheral circuits formed on the second substrate 200 may be electrically connected to each other.

As described above, the vertical memory cells may be formed on the first substrate 102, and the circuit patterns constituting the peripheral circuit may be formed on the second substrate 200. In addition, the vertical semiconductor device may have a structure in which the first and second substrates 102 and 200 are bonded to each other with the adhesive layer 104 and the lower insulating interlayer 220 interposed therebetween.

The vertical memory cells formed on the first substrate 102 and the circuit patterns formed on the second substrate 200 may be formed by separate processes. Therefore, when the vertical memory cell is formed, heat and stress may not be applied to the circuit patterns, and thus degradations of the characteristics of the circuit pattern may not occur. Therefore, the vertical semiconductor device may have improved electrical characteristics.

FIGS. 3 to 14 are plan views and cross-sectional views illustrating stages of a method of manufacturing a vertical semiconductor device in accordance with an example embodiment.

Figure 3:
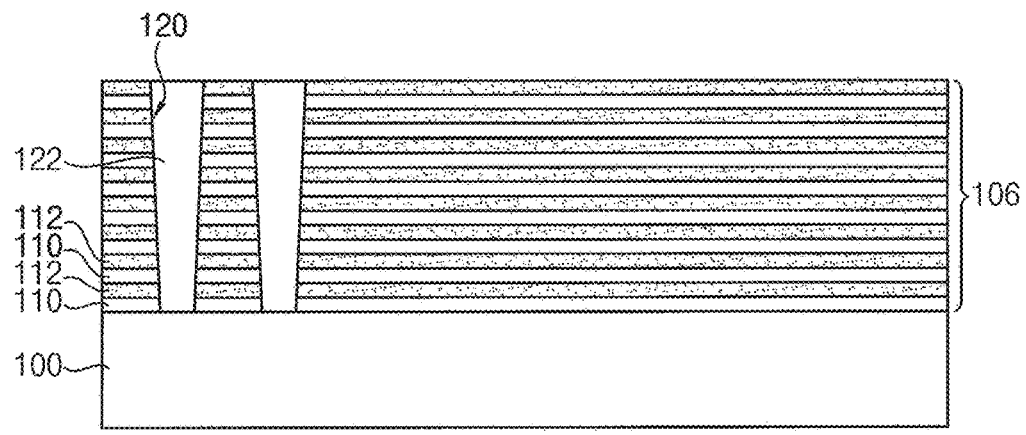
Figure 4:
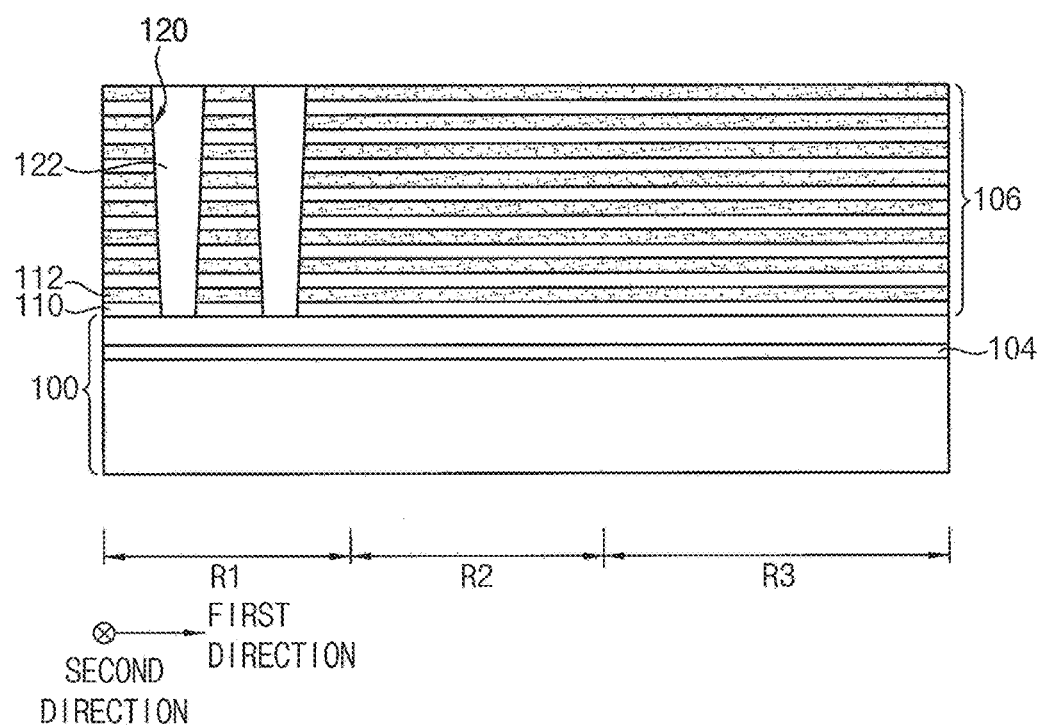

Referring to FIGS. 3 and 4, the first insulation layer 110 and the first sacrificial layer 112 may be alternately and repeatedly stacked on the upper surface of the preliminary first substrate 100 to form a preliminary first mold structure 106 having a first height. The first insulation layer 110 may include silicon oxide. The first sacrificial layer 112 may include a material having an etch selectivity with respect to the first insulation layer 110. For example, the first sacrificial layer 112 may include nitride such as silicon nitride.

In the preliminary first mold structure 106, portions for forming channel structures may be etched to form lower channel holes 120 exposing a surface of the preliminary first substrate 100. Thereafter, a filling sacrificial pattern 122 may be formed to fill each of the lower channel holes 120.

In some example embodiments, as shown in FIG. 3, the preliminary first substrate 100 may be a bare substrate including a single crystal semiconductor material (e.g., silicon, germanium, or silicon-germanium).

In some example embodiments, as shown in FIG. 4, the preliminary first substrate 100 may be a silicon-on-insulator (SOI) substrate or a germanium-on-insulator (GOI) substrate. In this case, an insulation layer may be included in the preliminary first substrate 100. For example, the insulation layer may serve as the adhesive layer 104.

Referring to FIG. 5, the first insulation layer 110 and the first sacrificial layer 112 are alternately and repeatedly stacked on the preliminary first mold structure 106 to form a preliminary second mold structure having a second height. Thus, a preliminary mold structure 108 including the preliminary first and second mold structures may be formed.

Portions of the preliminary second mold structure may be etched to expose the filling sacrificial patterns so that upper channel holes 124 may be formed on the filling sacrificial patterns, respectively. Thereafter, the filling sacrificial patterns 122 may be removed. Thus, the lower channel hole 120 and the upper channel hole 124 may be in communication with each other to form a channel hole. In this case, a sidewall of the channel hole 126 may have a bent portion between the lower and upper channel holes 120 and 124.

However, the process for forming the channel hole may not be limited thereto. Although not shown, for example, the first insulation layer 110 and the first sacrificial layer 112 may be alternately and repeatedly stacked to form a preliminary mold structure having a desired height, and the preliminary mold structure may be etched to form channel holes exposing the surface of the preliminary first substrate 100. In this case, a sidewall of the channel hole may have no bent portion.

Figure 6:
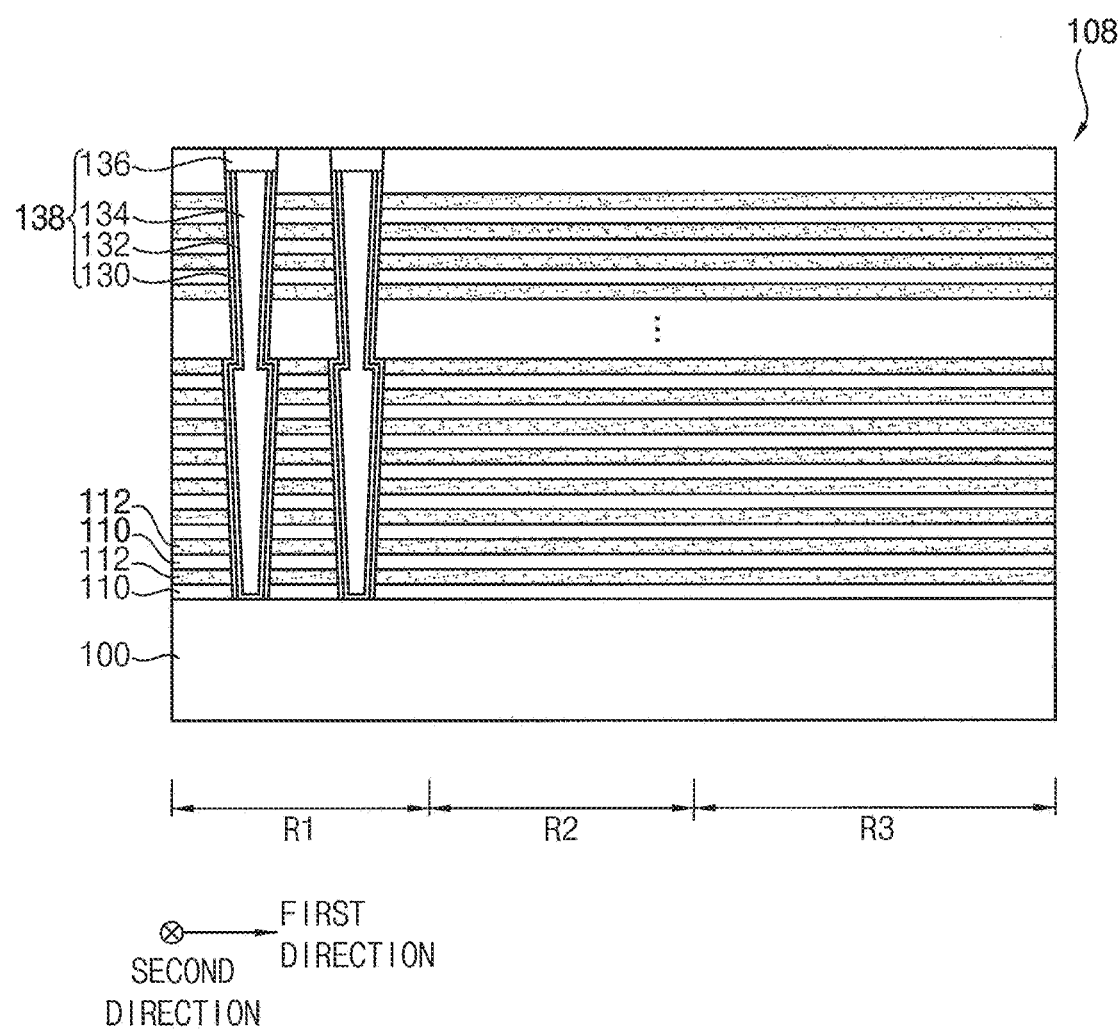

Referring to FIG. 6, a channel structure 138 may be formed in the channel hole 126. The channel structure 138 may include a charge storage structure 130, a channel 132, a filling insulation pattern 134, and a capping pad pattern 136.

In some example embodiments, the charge storage structure 130 may be formed on the sidewalls of the channel hole 126. Thereafter, a channel layer may be formed on the charge storage structure 130 and the preliminary first substrate 100, and a filling insulation layer may be formed to fill the channel hole 126 on the channel layer. The filling insulation layer, the channel layer, and the charge storage structure may be planarized until an upper surface of the preliminary mold structure 108 is exposed. Upper portions of the filling insulation layer and the channel layer may be removed to form the filling insulation pattern 134 and the channel 132. A capping pad pattern 136 may be formed to fill a recess above the filling insulation pattern 134 and the channel 132. The capping pad pattern 136 may include polysilicon.

In some example embodiments, a selective epitaxial process using the preliminary first substrate 100 exposed by the channel hole 126 as a seed may be performed to form a semiconductor pattern 128 (see FIG. 2) on the preliminary first substrate 100. In this case, the channel structure 138 may be formed on the semiconductor pattern 128. Further, if subsequent processes described hereinafter are performed in the same manner, the vertical semiconductor device shown in FIG. 2 may be manufactured.

Figure 7:
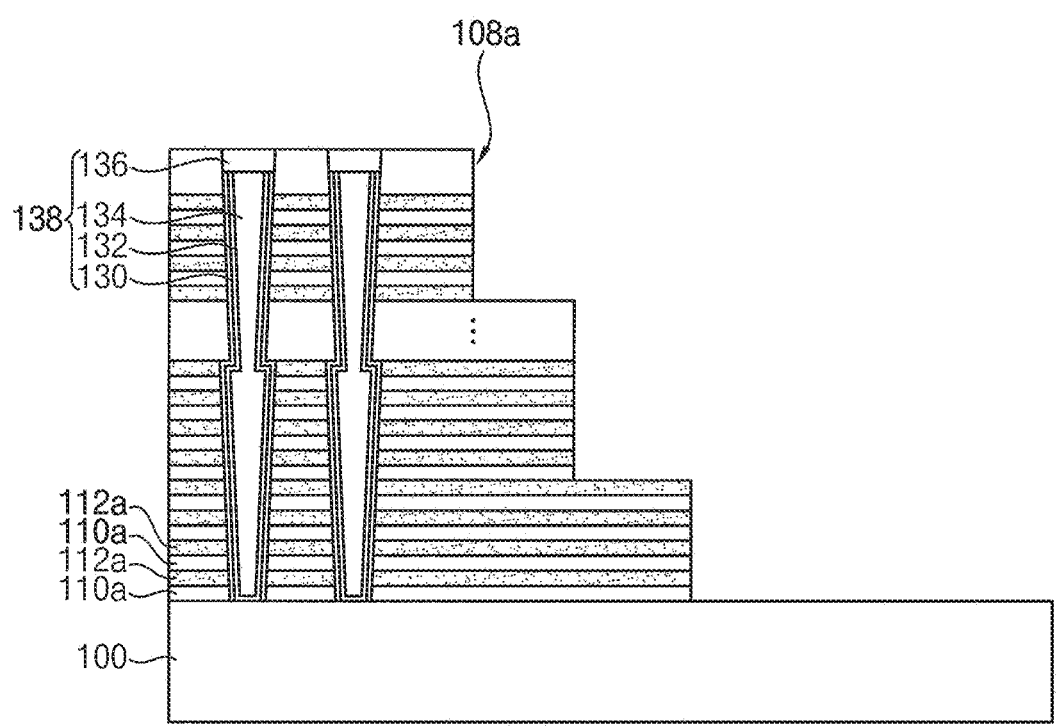

Referring to FIG. 7, a portion of the preliminary mold structure 108 may be etched to form a mold structure 108a having a staircase shape at an edge portion thereof. The mold structure 108a may have a structure including the first insulation pattern 110a and the first sacrificial pattern 112a alternately and repeatedly stacked.

In some example embodiments, the mold structure 108a may have the staircase shape in the first direction and the second direction, respectively. For example, one stepped layer in the first direction may include a plurality of first insulation patterns 110a and a plurality of first sacrificial patterns 112a. Further, one stepped layer in the second direction may include one of the first insulation patterns 110a and one of the first sacrificial patterns 112a.

In some example embodiments, the edge portions of the mold structure 108a may have the staircase shape only in the first direction. In this case, one stepped layer may include one of the first insulation patterns 110a and one of the first sacrificial patterns 112a.

Figure 8:
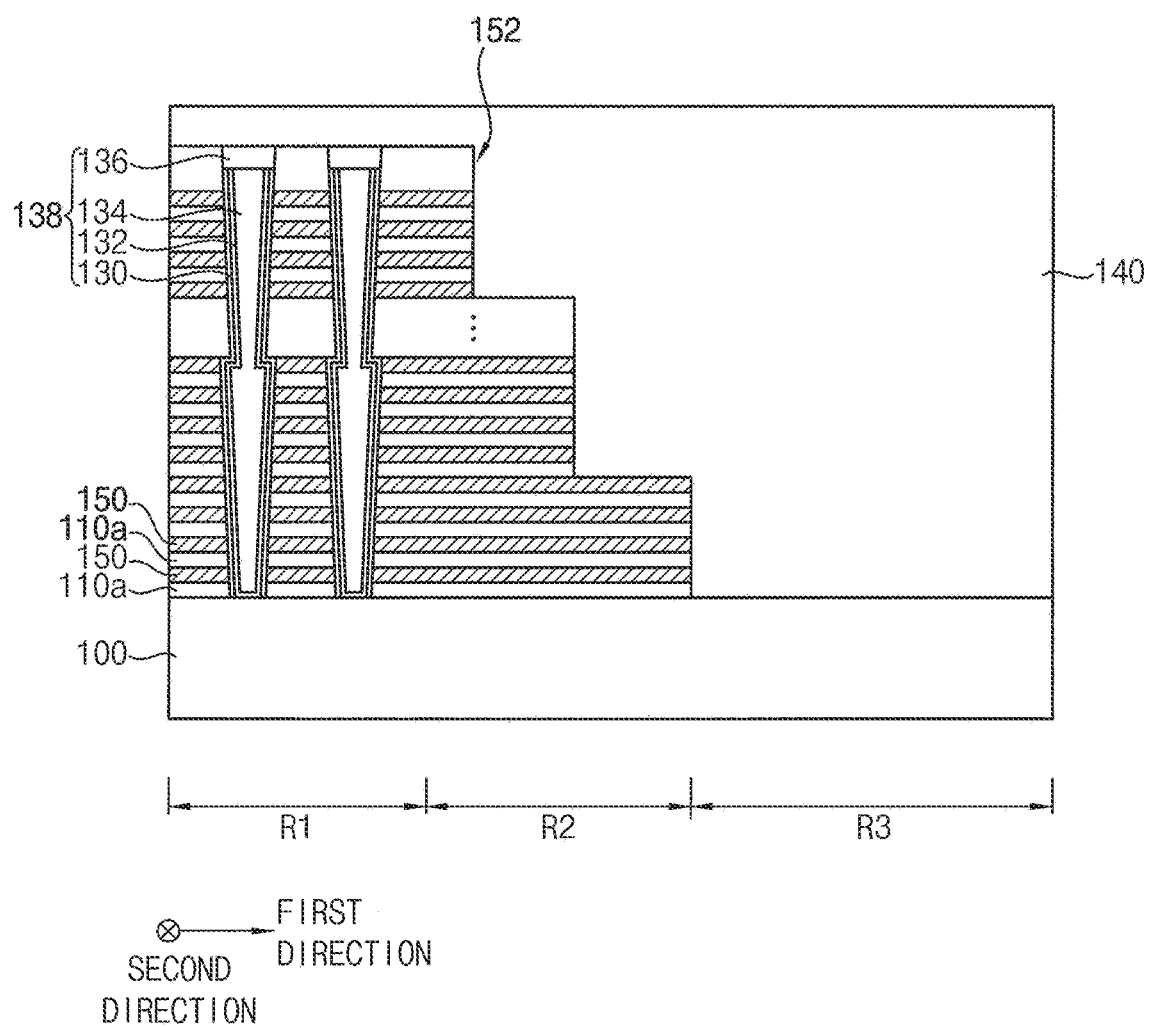

Referring to FIG. 8, an insulation layer may be formed to cover the mold structure 108a. An upper portion of the insulation layer may be planarized to form a first insulating interlayer 140. The first insulating interlayer 140 may include silicon oxide.

Thereafter, a gate replacement process may be performed in which the first sacrificial patterns 112a included in the mold structure 108a may be replaced with first conductive patterns 150, respectively. The first conductive pattern 150 may include metal (e.g., tungsten, copper, or aluminum).

Although not specifically illustrated, an opening for dividing of the mold structure 108a may be formed in the mold structure 108a. The opening may extend in the first direction. For example, the opening may serve as a block cutting region or a word line cutting region.

The first sacrificial patterns 112a exposed by a sidewall of the opening may be removed to form gaps. The removing process may include a wet etching process. A first conductive layer may be formed to fill the gaps. A barrier metal layer may be further formed on surfaces of the gaps, before forming the first conductive layer. Thereafter, the first conductive layer formed in the opening may be removed to form the first conductive patterns 150 in each of the gaps.

Thus, the conductive pattern structure 152 may be formed to have the first insulation pattern 110a and the first conductive pattern 150 alternately and repeatedly stacked.

Although not shown, an insulation pattern may be formed to fill the opening. Further, contact plugs (not shown) may be formed through the first insulating interlayer 140. The contact plug may contact upper surfaces of the first conductive patterns 150 having the stair case shape.

When the processes are performed, vertical memory cells including the conductive pattern structure 152 and the channel structures 138 may be formed on the preliminary first substrate 100. Further, portions of the first conductive patterns 150 having the stair case shape may serve as gate pads, respectively.

The preliminary first substrate 100 includes a first region R1 in which the vertical memory cells are formed, a second region R2 in which the gate pads are formed, and a third region R3 of region disposed at a lateral direction of the gate pad.

Figure 9:
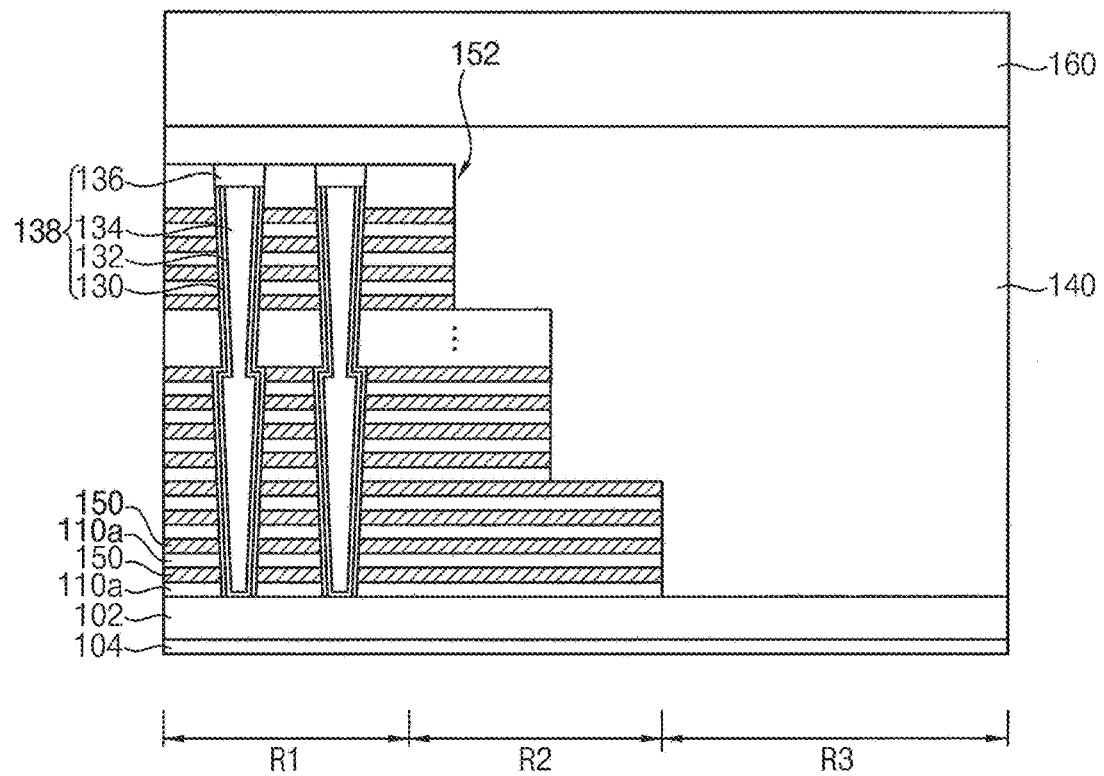

Referring to FIG. 9, a carrier substrate 160 may be attached to an upper surface of the first insulating interlayer 140 formed on the preliminary first substrate 100.

Thereafter, the lower surface of the preliminary first substrate 100 may be grinded to form a first substrate 102 having a first thickness. The first thickness may be, e.g., about 0.1 μm to about 1 μm. If the first thickness is less than 0.1 μm, handling of the first substrate may not be easy. If the first thickness is greater than 1 μm, subsequent wiring processes may not be easy.

An adhesive layer 104 may be formed on the lower surface of the first substrate 102. The adhesive layer 104 may serve as a layer for bonding the first and second substrates 102 and 200 in a subsequent process. In some example embodiments, a plasma treatment may be further performed on a surface of the adhesive layer 104.

Alternatively, as described with reference to FIG. 4, when the preliminary first substrate 100 is used as a silicon-on-insulator (SOI) substrate or a germanium-on-insulator (GOI) substrate, the preliminary first substrate 100 may be grinded to expose an insulation layer, and thus the first substrate 102 may be formed. The insulation layer may serve as an adhesive layer. Thus, the process of forming the adhesive layer 104 on the lower surface of the first substrate 102 may be omitted.

Figure 10:
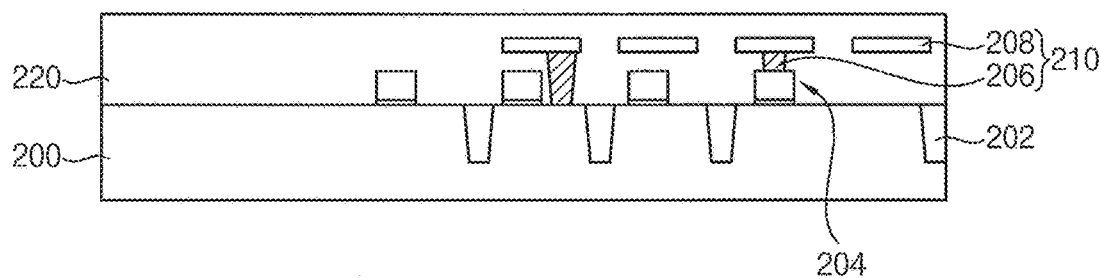

Referring to FIG. 10, a second substrate 200 is provided.

A first isolation pattern 202 may be formed at an upper portion of the second substrate 200 by a trench isolation process. Thus, a field region in which the first isolation pattern 202 is formed and an active region in which the first isolation pattern 202 is not formed may be formed on the second substrate 200.

Circuit patterns constituting a peripheral circuit may be formed on the second substrate 200. A lower insulating interlayer 220 may be formed to cover the circuit patterns.

The circuit pattern may include first transistors 204 and lower wirings 210. The first transistors 204 may include gate structures and impurity regions. The lower wiring 210 may include a lower contact plug 206 and a lower pad pattern 208. The lower contact plugs 206 may be formed to contact the gate structure and/or the impurity region. The lower pad pattern 208 may be electrically connected to the lower contact plugs 206. At least one of the lower pad patterns may serve as a pad pattern 208 electrically connected to the vertical memory cells.

The lower insulating interlayer 220 may include silicon oxide. After forming the lower insulating interlayer 220, the surface of the lower insulating interlayer 220 may be planarized. Thus, an upper surface of the lower insulating interlayer 220 may be flat.

As described above, the vertical memory cells on the first substrate 102 and the circuit patterns on the second substrate 200 may be formed by separate processes. Thus, during forming the vertical memory cells, heat and stress may not be applied to the circuit pattern. Therefore, a degradation of the circuit pattern may not occur.

Figure 11:
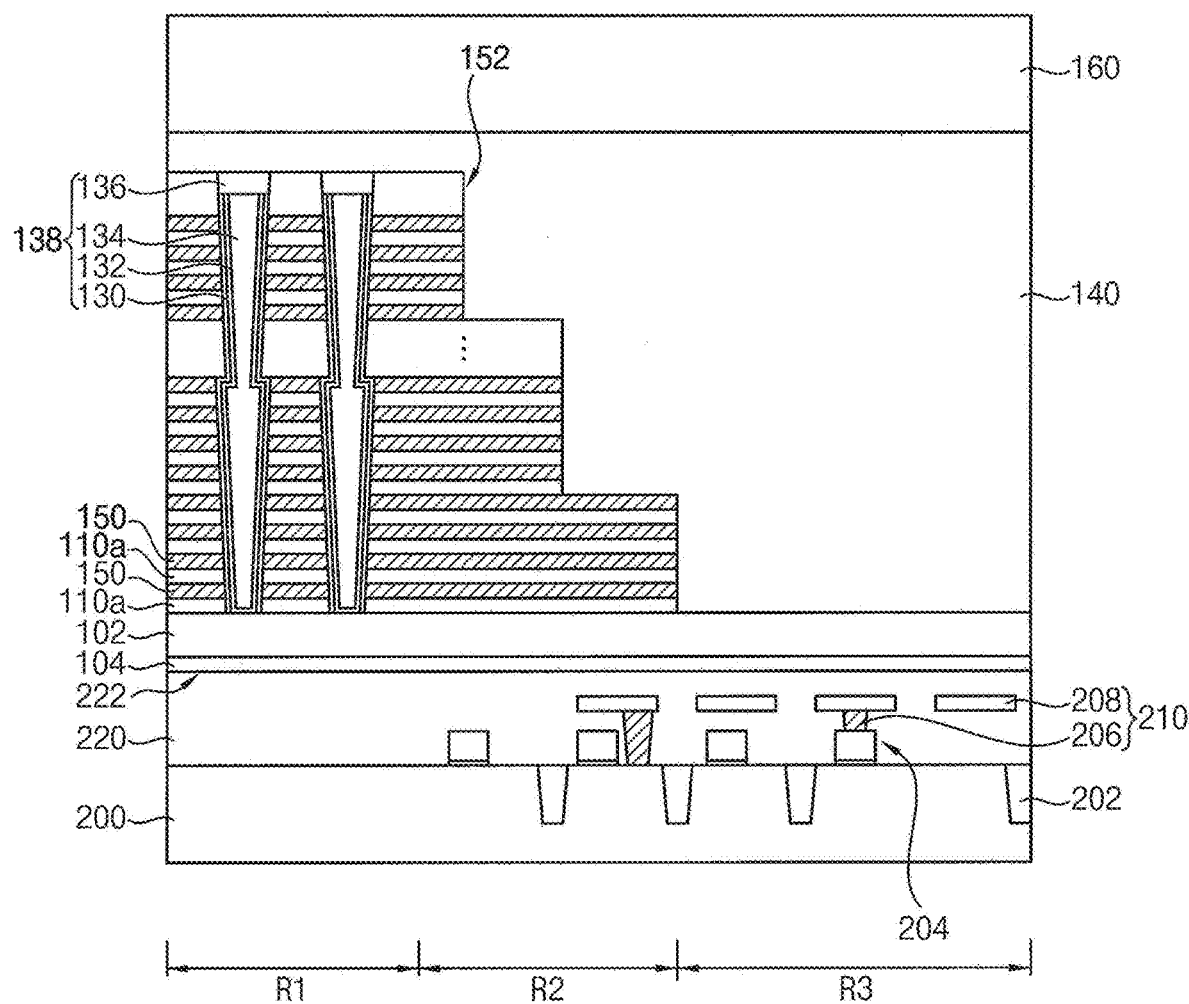

Referring to FIG. 11, the adhesive layer 104 formed on the lower surface of the first substrate 102 and the lower insulating interlayer 220 formed on the second substrate 200 may be disposed so as to contact with each other, and the adhesive layer 104 and the lower insulating interlayer 220 may be bonded to each other by applying pressure with heating. Thus, the first and second substrates 102 and 200 may overlap, while being spaced apart from each other in the vertical direction. The first and second substrates 102 and 200 may be bonded to each other with the adhesive layer 104 and the lower insulating interlayer 220 interposed therebetween.

That is, a lower surface of the adhesive layer 104 and an upper surface of the lower insulating interlayer 220 may be a bonding interface 222. In some example embodiments, voids may be irregularly generated at the bonding interface 222.

In the processes, circuit patterns constituting the peripheral circuit may be formed on the second substrate 200, and vertical memory cells may be formed on the first substrate 102 located on the second substrate 200.

In some example embodiments, when the first and second substrates 102 and 200 are bonded, the lower pad pattern 208 may be formed on the second region R2 and the third region R3. For example, the lower pad pattern 208 may not be formed on the first region R1.

In some example embodiments, the lower pad pattern 208 may be formed on the third region R3. For example, the lower pad pattern 208 may not be formed on the first and second regions R1 and R2.

After the bonding process, the carrier substrate 160 formed on the first insulating interlayer 140 may be removed.

Figure 12:
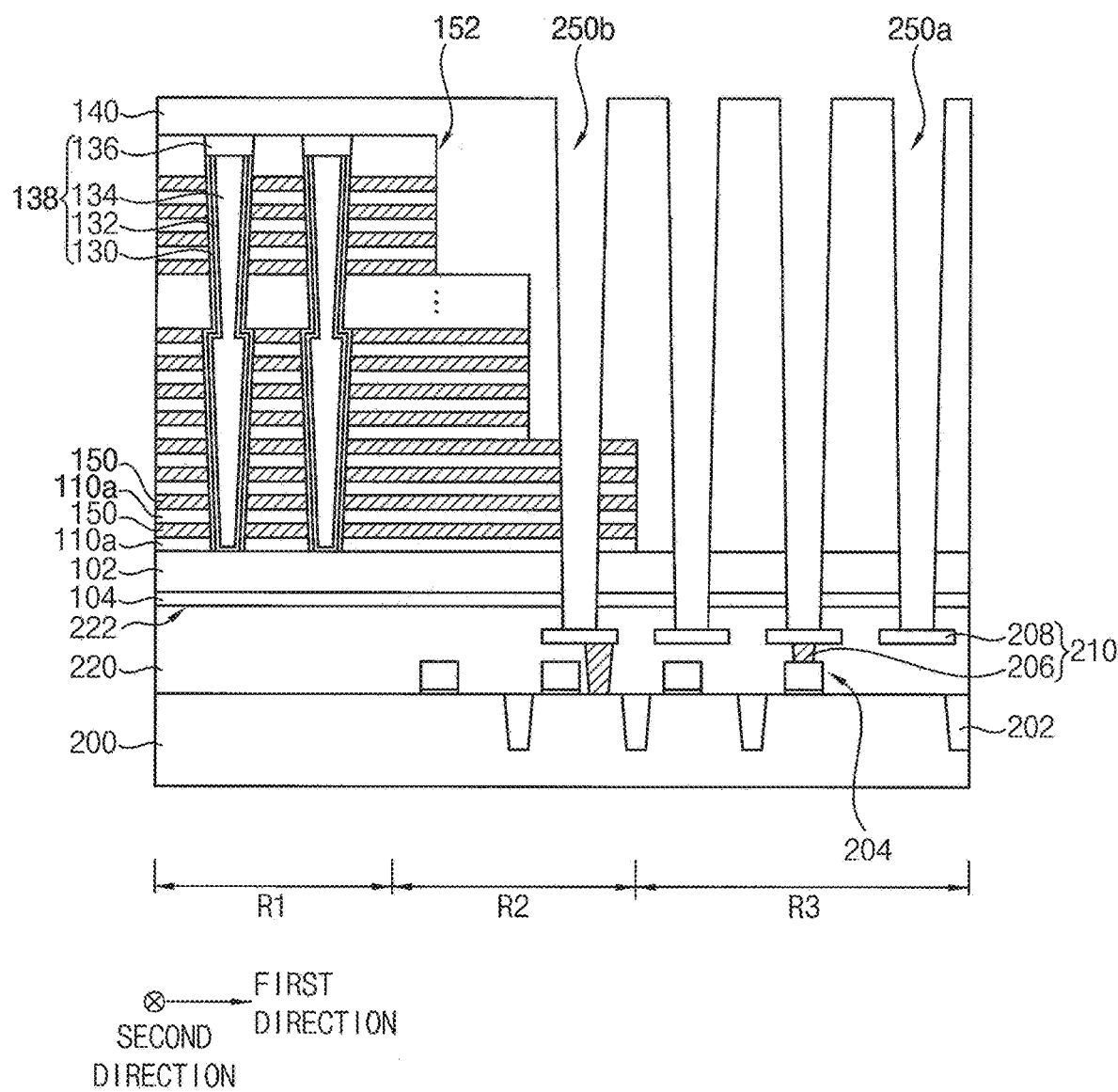

Referring to FIG. 12, through holes 250a and 250b may be formed through the first insulating interlayer 140 formed on the second and third regions R2 and R3 of the first substrate 102 and the first substrate 102. The through holes 250a and 250 may expose an upper surface of the lower pad pattern 208.

In some example embodiments, first through holes 250a may be formed through the first insulating interlayer 140, the first substrate 102, the adhesive layer 104, and the lower insulating interlayer 220 on the third region R3. The first through holes 250a may expose the upper surface of the lower pad pattern 208. Second through holes 250b may be formed through the first insulating interlayer 140, portions of the conductive pattern structure 152 having the staircase shape, the first substrate 102, the adhesive layer 104, and the lower insulating interlayer 220 on the second region R2. The second through holes 250b may expose the upper surface of the lower pad pattern 208.

In some example embodiments, only the first through holes 250a may be formed, and the second through holes 250b may not be formed.

Figure 13:
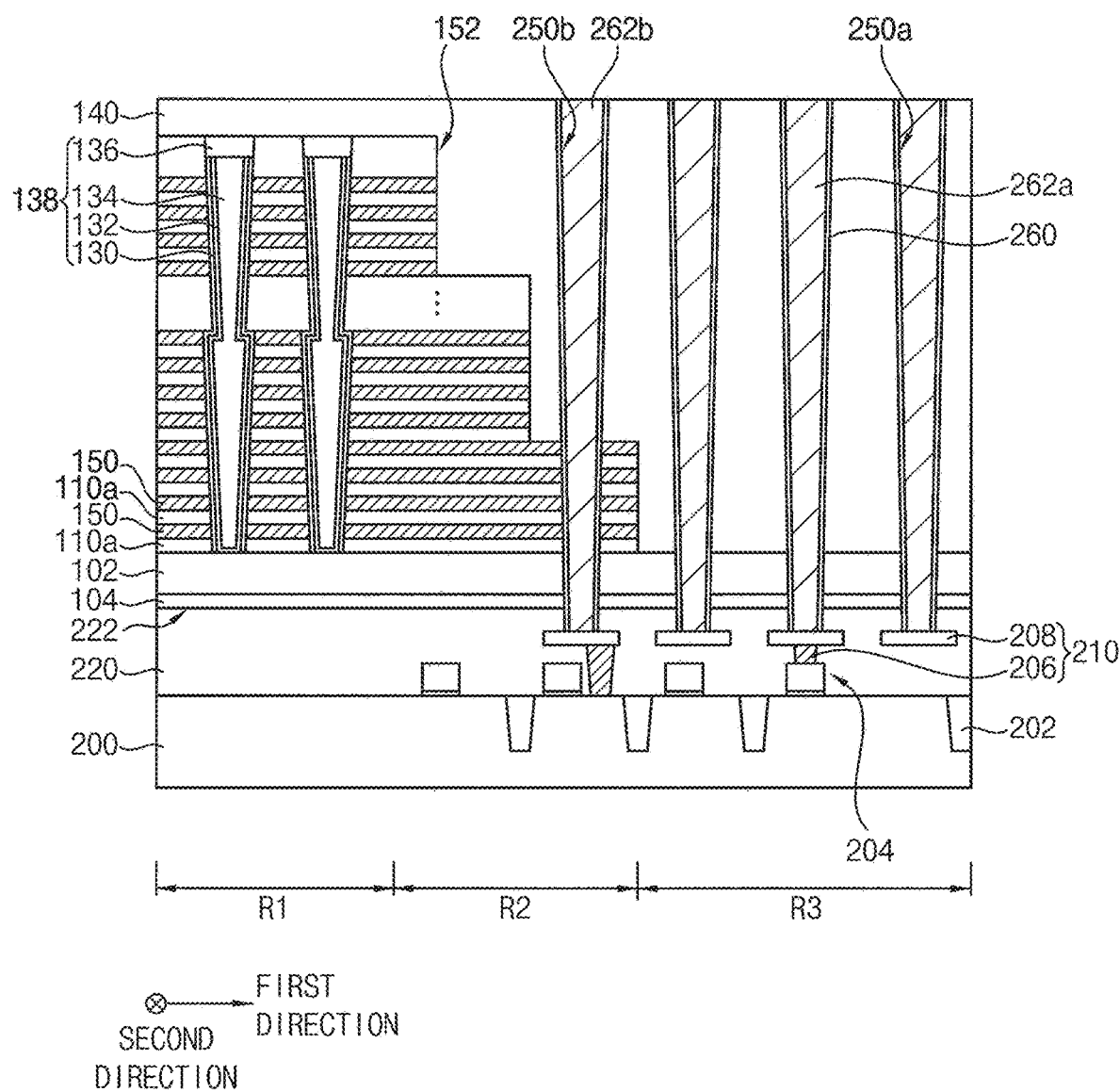

Referring to FIG. 13, insulation spacers 260 may be formed on sidewalls of the first and second through holes 250a and 250b.

Thereafter, a conductive layer may be formed to fill the first and second through holes 250a and 250b. The conductive layer may be planarized until an upper surface of the first insulating interlayer 140 is exposed to form first and second through via contacts 262a and 262b, respectively. The first and second through via contacts 262a and 262b may include a metal. In some example embodiments, a barrier layer may be further formed before forming the conductive layer.

Because the insulation spacers 260 are formed, the first through via contacts 262a and the first substrate 102 may be insulated from each other. Further, the second through via contact 262b, the first substrate 102, and the first conductive patterns 150 may be insulated from each other by the insulation spacers 260.

Figure 14:
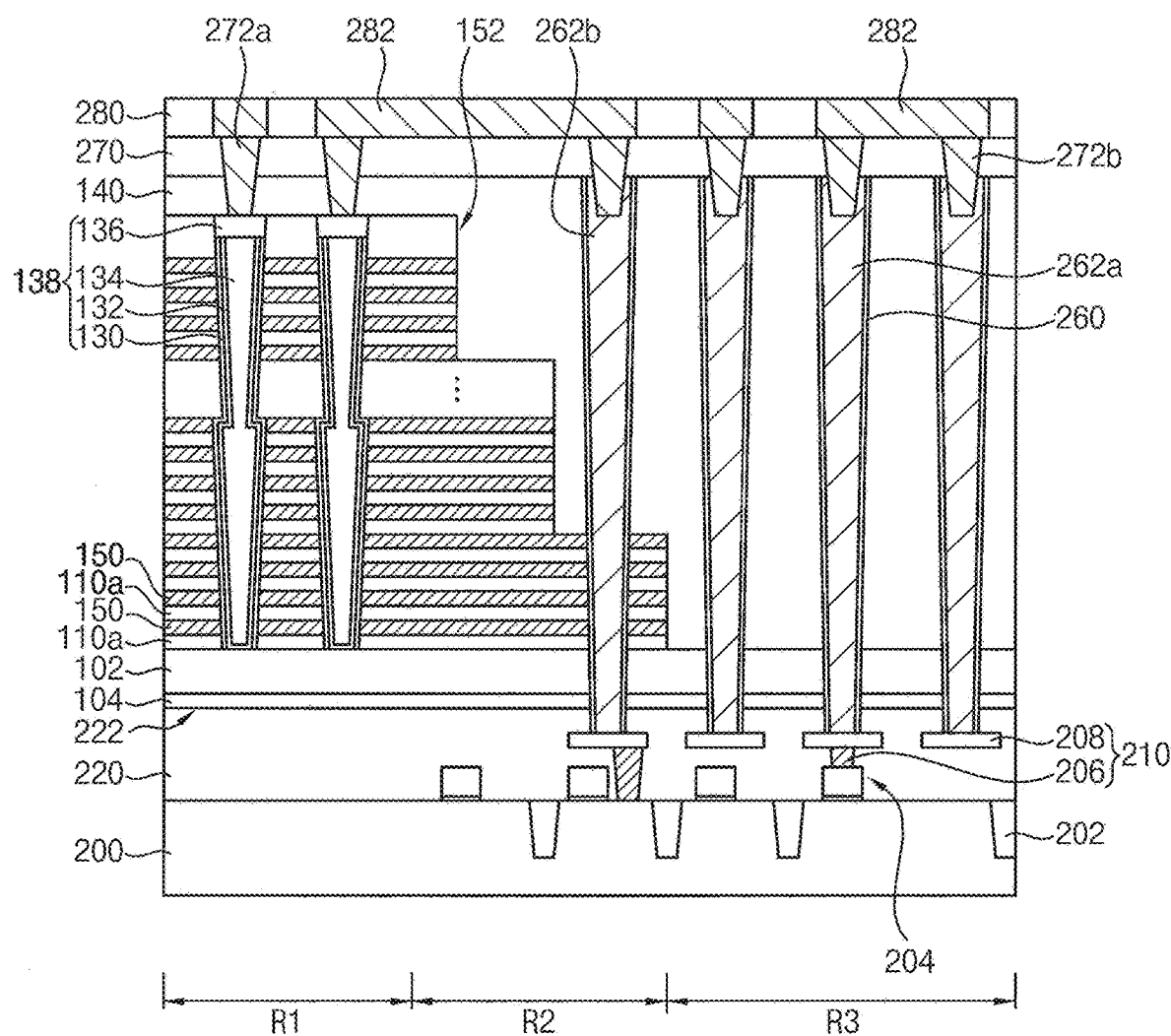

Referring to FIG. 14, a second insulating interlayer 270 may be formed on the first insulating interlayer 140. First and second upper contacts 272a and 272b may be formed through the first and second interlayers 270 and 140.

A third insulating interlayer 280 may be formed on the second insulating interlayer 270 and the first and second upper contacts 272a and 272b. Upper wirings may be formed in the third insulating interlayer 280 and connected with the first and second upper contacts 272a and 272b.

The first upper contacts 272a may contact the capping pad pattern 136 included in the channel structure 138 through the second and first insulating interlayers 270 and 140. The second upper contacts 272b may contact the first and second through via contacts 262a and 262b through the second insulating interlayer 270.

The upper wirings 282 may electrically connect the memory cell structure and the first and second through via contacts 262a and 262b to each other. Thus, the memory cell structure formed on the first substrate 102 and the peripheral circuits formed on the second substrate 200 may be electrically connected to each other.

In some example embodiments, some of the upper wiring 282 may electrically connect the capping pad pattern 136 to the peripheral circuits. In some example embodiments, some of the upper wiring 282 may electrically connect the first conductive pattern 150 included in the conductive pattern structure 152 to the peripheral circuits.

In some example embodiments, some of the upper wiring 282 may connect a plurality of through via contacts 262a and 262b to each other, and thus some of the peripheral circuits formed on the second substrate 200 may be electrically connected to each other.

As described above, the vertical memory cells on the first substrate and the circuit patterns on the second substrate are formed by separate processes. Thus, characteristics of the circuit patterns may not be deteriorated during forming the vertical memory cells. After the first and second substrates are formed, wiring processes for electrically connecting of elements formed on the first and second substrates may be performed. Thus, there is no need to consider the wiring in a bonding process of the first and second substrates. Thus, alignment of the first and second substrates may be easily performed in the bonding process of the first and second substrates.

Figure 15:
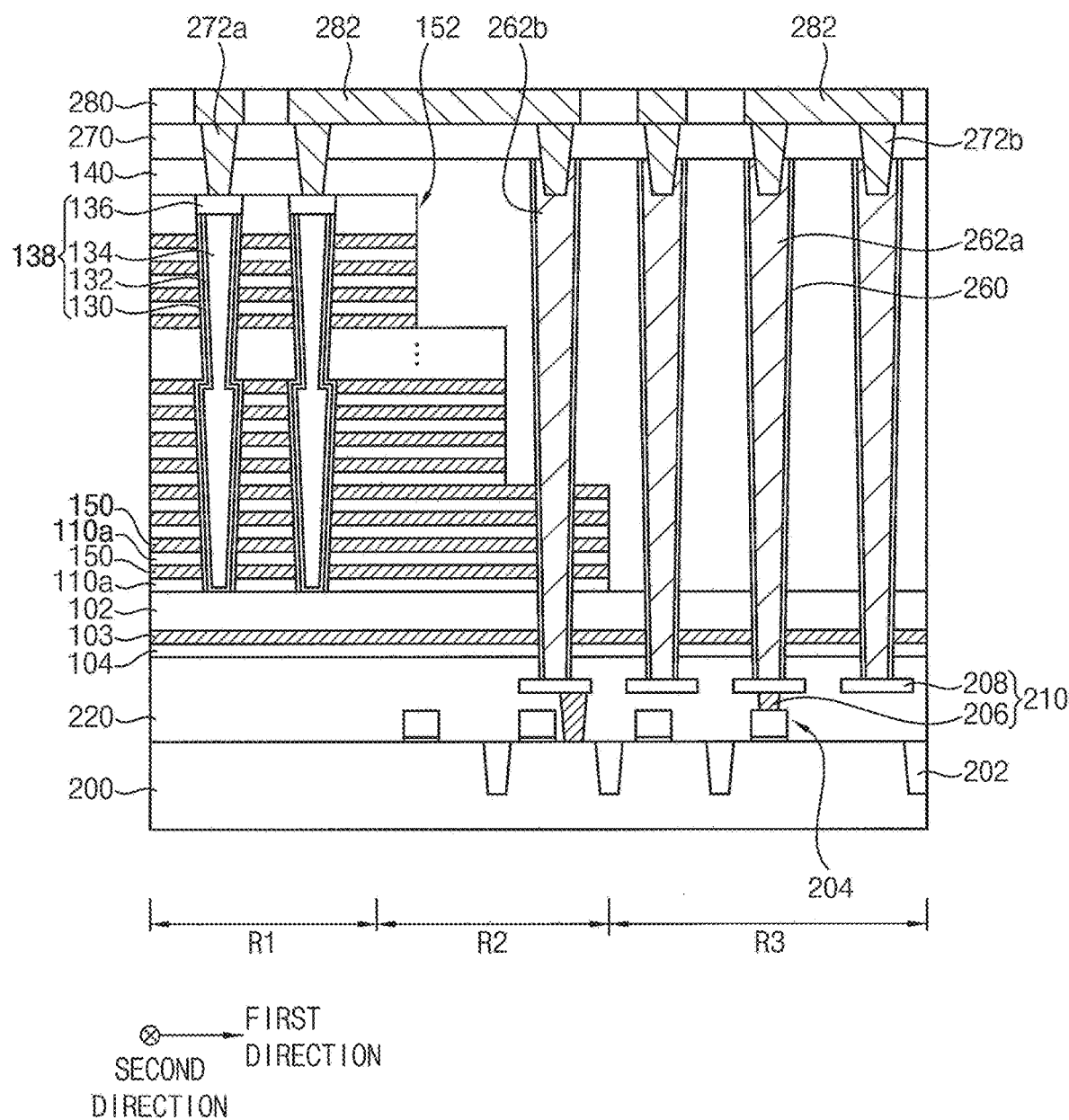

FIG. 15 is a cross-sectional view illustrating a vertical semiconductor device in accordance with an example embodiment.

The vertical semiconductor device may be the same as or substantially similar to the vertical semiconductor device illustrated with reference to FIG. 1 or 2, except that the vertical memory device further includes a lower conductive layer contacting the lower surface of the first substrate.

Referring to FIG. 15, the lower conductive layer 103 and the adhesive layer 104 may be stacked on a lower surface of the first substrate 102. That is, the lower conductive layer 103 may be interposed between the adhesive layer 104 and the first substrate 102.

The lower conductive layer 103 may include metal and/or metal silicide. In some example embodiments, the lower conductive layer 103 may include tungsten or tungsten silicide.

In some example embodiments, the lower conductive layer 103 may serve as a common source in the vertical memory cells.

Figure 16:
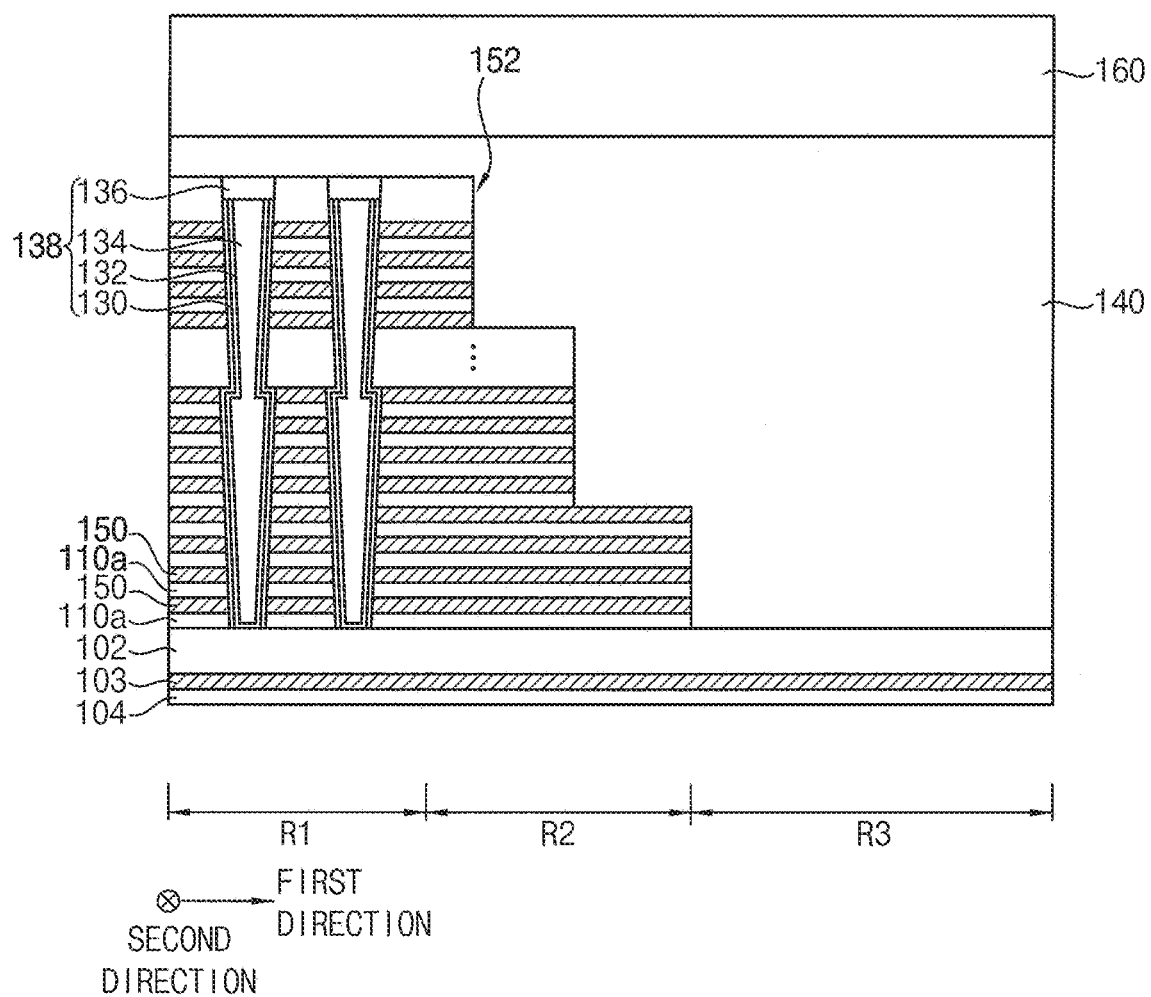

FIG. 16 is a cross-sectional view illustrating a stage of a method of manufacturing a vertical semiconductor device including the lower conductive layer of FIG. 15, in accordance with an example embodiment.

Referring to FIG. 16, first, the same processes as illustrated with reference to FIGS. 3 to 8 is performed.

Thereafter, a carrier substrate 160 may be attached to an upper surface of the first insulating interlayer 140 formed on the preliminary first substrate 100. A lower surface of the preliminary first substrate 100 may be grinded to form the first substrate 102.

The lower conductive layer 103 may be formed on the lower surface of the first substrate 102. The adhesive layer 104 may be formed on the lower conductive layer 103. In some example embodiments, a plasma treatment may be further performed on the surface of the adhesive layer 104.

Thereafter, the same processes as illustrated with reference to FIGS. 10 to 14 may be performed to form the vertical semiconductor device shown in FIG. 15.

Figure 17:
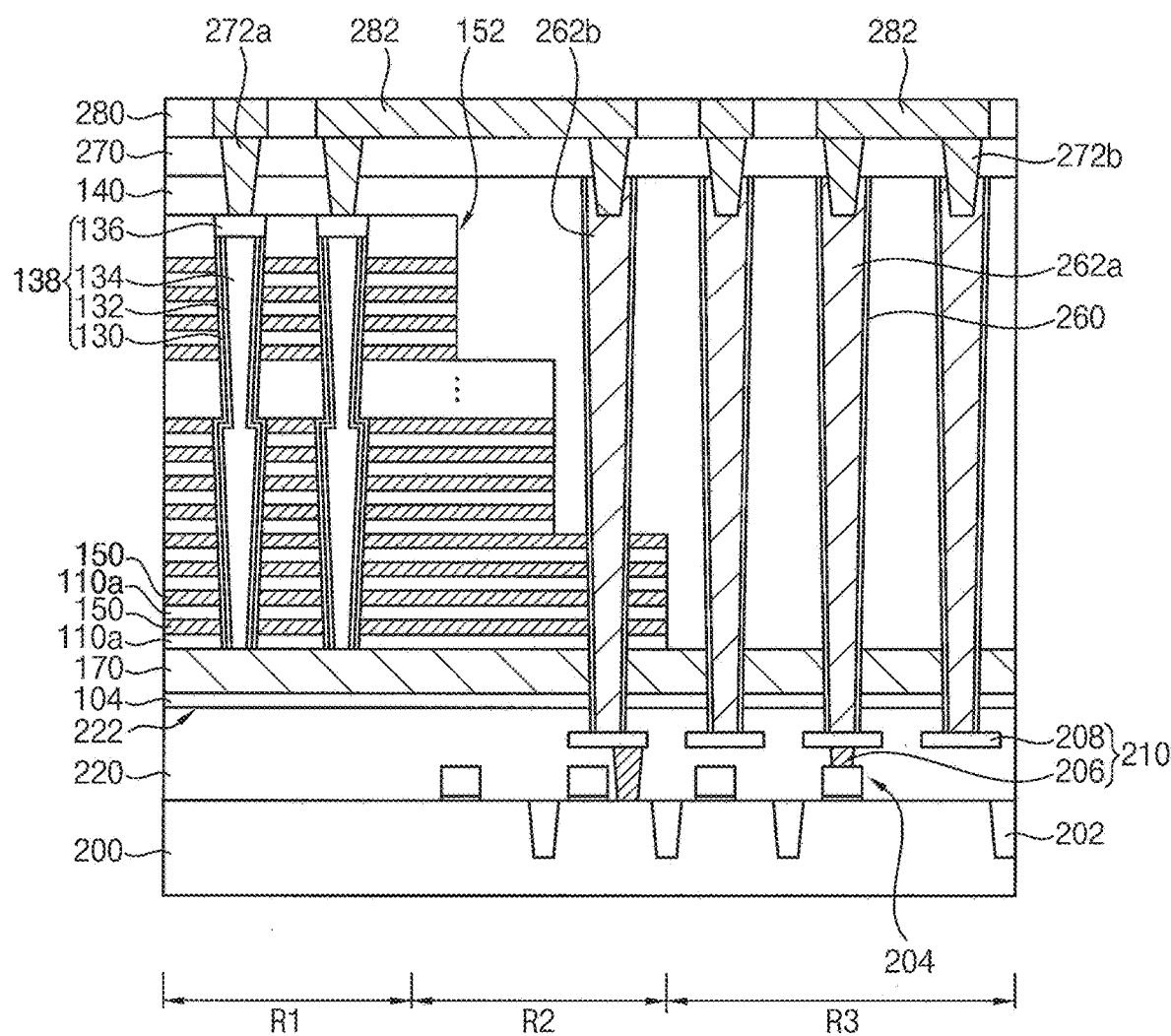

FIG. 17 is a cross-sectional view illustrating a vertical semiconductor device in accordance with an example embodiment.

The vertical semiconductor device may be the same as the vertical semiconductor device illustrated with reference to FIG. 1, except for the first substrate being replaced with a polysilicon layer and a shape of the channel structure.

Referring to FIG. 17, the polysilicon layer 170 may be provided instead of the first substrate in the vertical semiconductor device illustrated with reference to FIG. 1.

The channel structure 138 may contact an upper surface of the polysilicon layer 170. The channel structure 138 may include the charge storage structure 130, the channel 132, the filling insulation pattern 134, and the capping pad pattern 136.

In some example embodiments, the charge storage structure 130 and the channel 132 may have a cylindrical shape with an open bottom. Thus, a lower portion of the channel 132 may contact the polysilicon layer 170. A lower surface of the filling insulation pattern 134 may contact the polysilicon layer 170.

Figure 18:
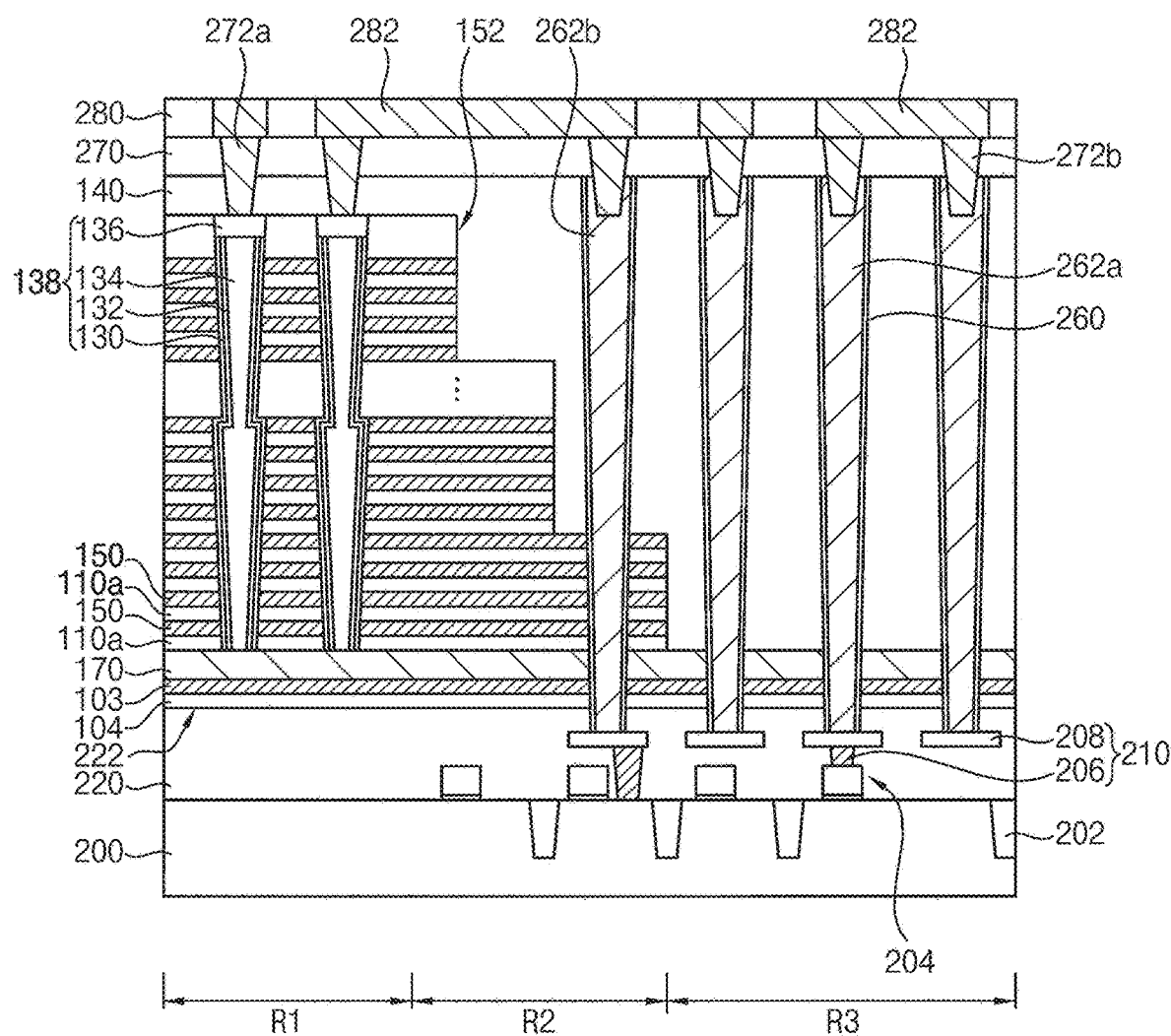

FIG. 18 is a cross-sectional view illustrating a vertical semiconductor device in accordance with an example embodiment.

The vertical semiconductor device shown in FIG. 18 may be the same as the vertical semiconductor device illustrated with reference to FIG. 17, except that a lower conductive layer 103 is further included between the polysilicon layer 170 and the adhesive layer 104.

Referring to FIG. 18, the lower conductive layer 103 may include metal and/or metal silicide. In some example embodiments, the lower conductive layer 103 may include tungsten or tungsten silicide. In some example embodiments, the lower conductive layer 103 may serve as a common source in the vertical memory cells.

Although not shown, in the vertical semiconductor devices in accordance with the example embodiments illustrated later, the lower conductive layer 103 may be interposed between the first substrate 102 and the adhesive layer 104 or between a first substrate pattern and the adhesive layer 104. The lower conductive layer 103 may serve as a common source in vertical memory cells.

Although not shown, in the vertical semiconductor devices in accordance with the example embodiments illustrated later, the lower conductive layer 103 may be interposed between the polysilicon layer 170 and the adhesive layer 104 or between a polysilicon pattern and the adhesive layer 104. The lower conductive layer may serve as a common source in vertical memory cells.

Figure 19:
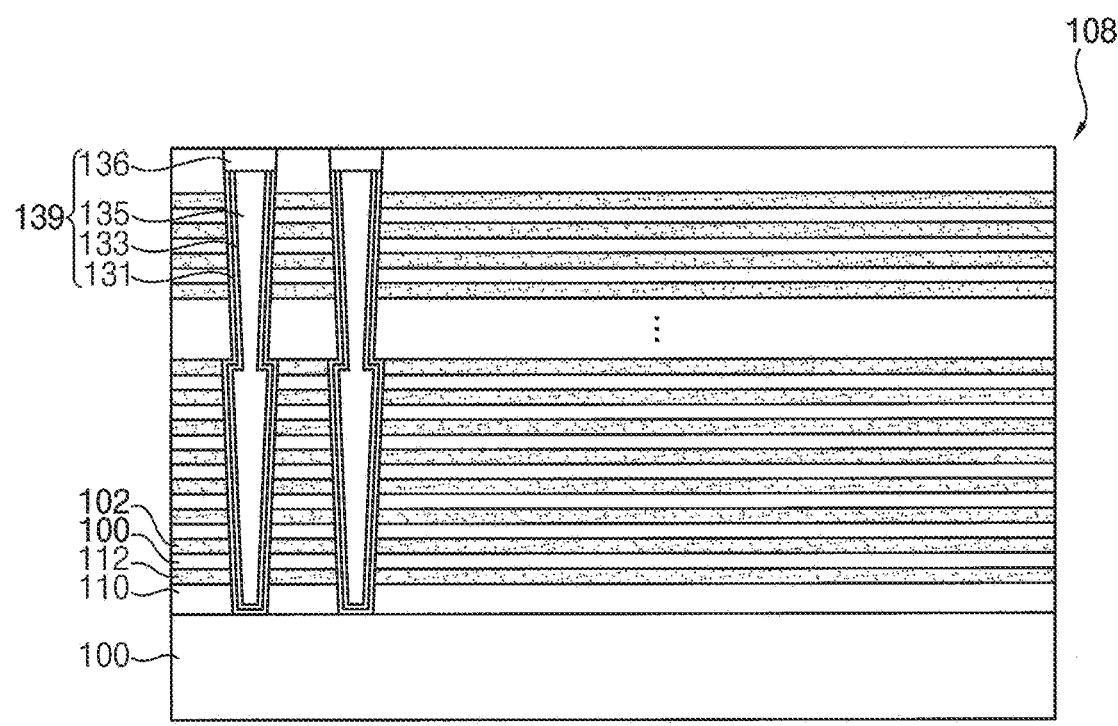
Figure 20:
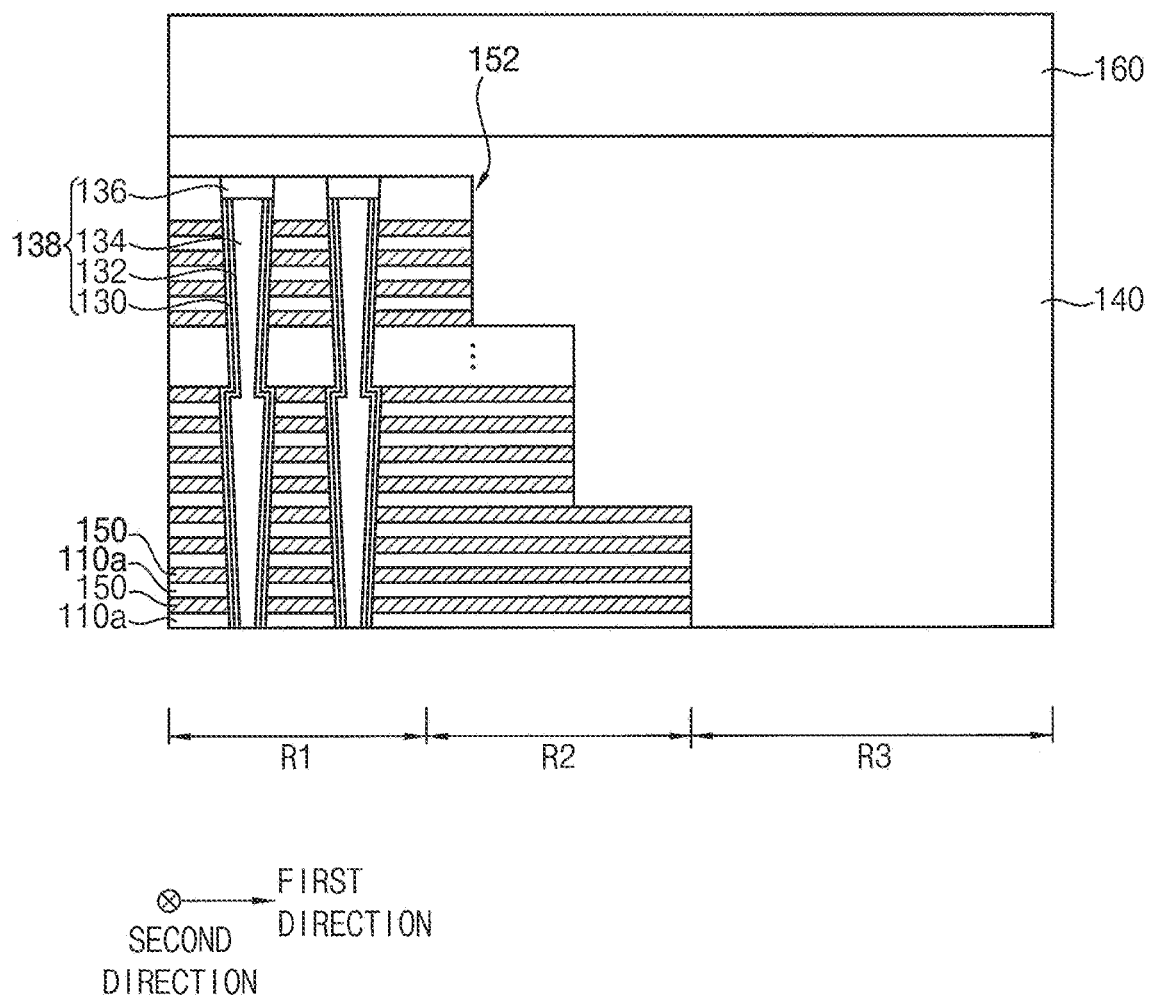
Figure 21:
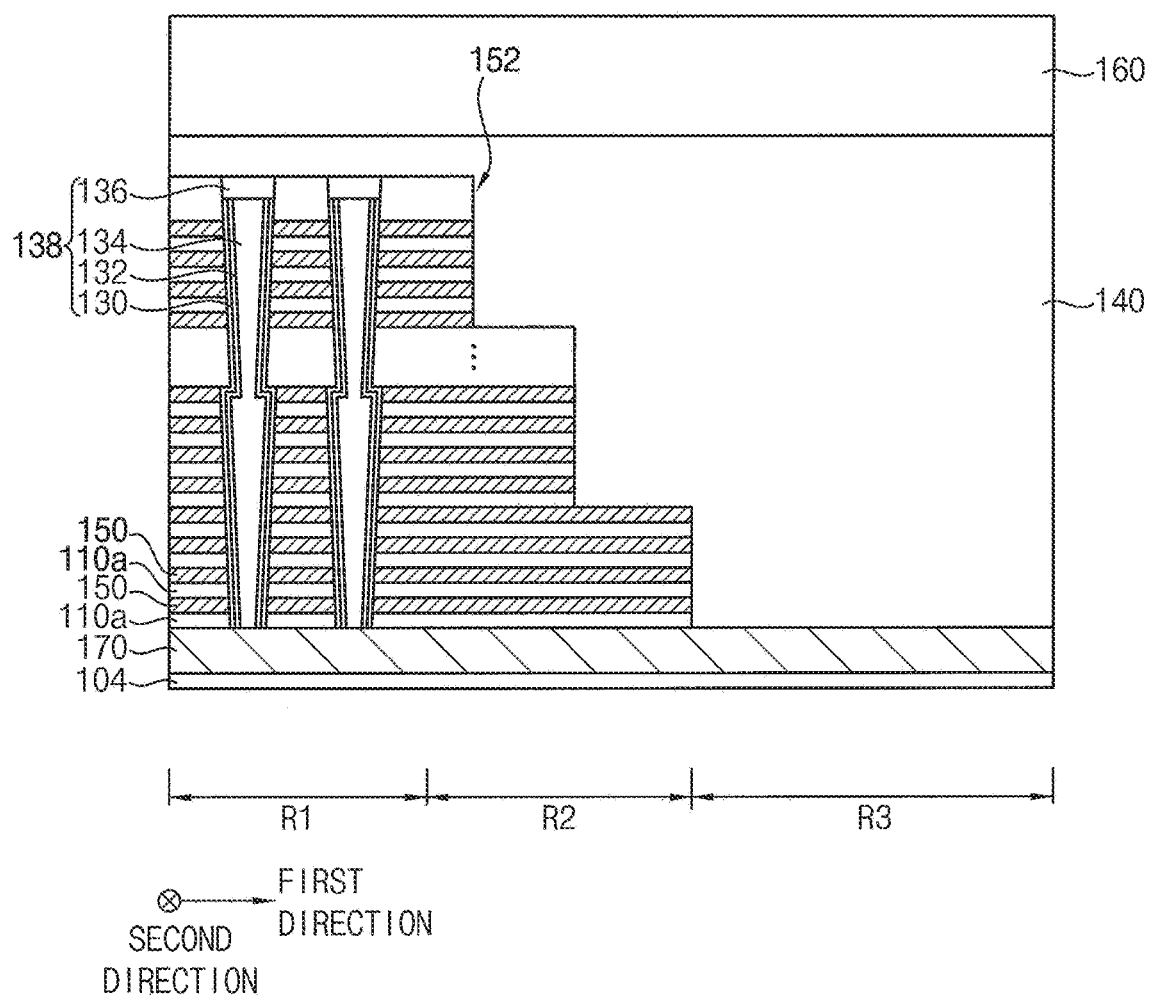

FIGS. 19 to 21 are cross-sectional views illustrating stages of a method of manufacturing a vertical semiconductor device in accordance with an example embodiment.

Referring to FIG. 19, first, the same processes as illustrated with reference to FIGS. 3 to 5 are performed. However, the insulation layer formed at a lowermost portion of the preliminary first substrate may have a thickness greater than thicknesses of the insulation layers of other portions.

Thereafter, a preliminary channel structure 139 may be formed in the channel hole. The preliminary channel structure 139 may include a preliminary charge storage structure 131, the channel layer 133, the filling insulation layer 135, and the capping pad pattern 136. In the preliminary channel structure 139, the channel layer 133 may not contact the preliminary first substrate.

In some example embodiments, the preliminary charge storage structure 131 and the channel layer 133 are conformally formed on a sidewall and a lower surface of the channel hole, and a filling insulation layer 135 may be formed on the channel layer 133 to fill the channel hole. Thereafter, upper portions of the channel layer 133 and the filling insulation layer 135 may be etched to form a recess. The capping pad pattern 136 may be formed to fill the recess. Thus, the preliminary channel structure 139 may be formed to fill the channel hole.

Referring to FIG. 20, first, the processes illustrated with reference to FIGS. 7 and 8 are performed in the same manner.

Thereafter, the carrier substrate 160 may be attached to an upper surface of the first insulating interlayer 140 formed on the preliminary first substrate 100. The preliminary first substrate 100 may be removed by grinding a lower surface of the preliminary first substrate 100. When the preliminary first substrate 100 is removed, a lower surface of the preliminary channel structure 139 may be exposed.

The grinding process may be continually performed to remove a lower portion of the preliminary channel structure 139 so that the preliminary charge storage structure 131 and the channel layer 133 have a cylindrical shape with an open bottom. Thus, the preliminary channel structure 139 may be transformed to the channel structure 138 including the charge storage structure 130, the channel 132, the filling insulation pattern 134, and the capping pad pattern 136.

When the grinding process is performed, lower surfaces of a lowermost first insulation pattern 110a and the channel structure 138 may be exposed.

Referring to FIG. 21, the polysilicon layer 170 may be formed on the lower surfaces of the lowermost first insulation pattern 110a and the channel structure 138. The adhesive layer 104 may be formed on a lower surface of the polysilicon layer 170.

The polysilicon layer 170 may be formed by a deposition process after the grinding process. Thus, the polysilicon layer 170 may not be as thick as the first thickness of the first substrate illustrated with reference to FIG. 1. For example, the polysilicon layer 170 may be formed to have the thickness equal to or thinner than the first thickness.

Thereafter, the processes illustrated with reference to FIGS. 10 to 14 may be performed to form the vertical semiconductor device shown in FIG. 17.

In some example embodiments, a lower conductive layer (103 in FIG. 18) may be further formed on the lower surface of the polysilicon layer. The adhesive layer 104 may be formed on the lower conductive layer. Thereafter, the processes illustrated with reference to FIGS. 10 to 14 may be performed to form the vertical semiconductor device shown in FIG. 18.

Figure 22:
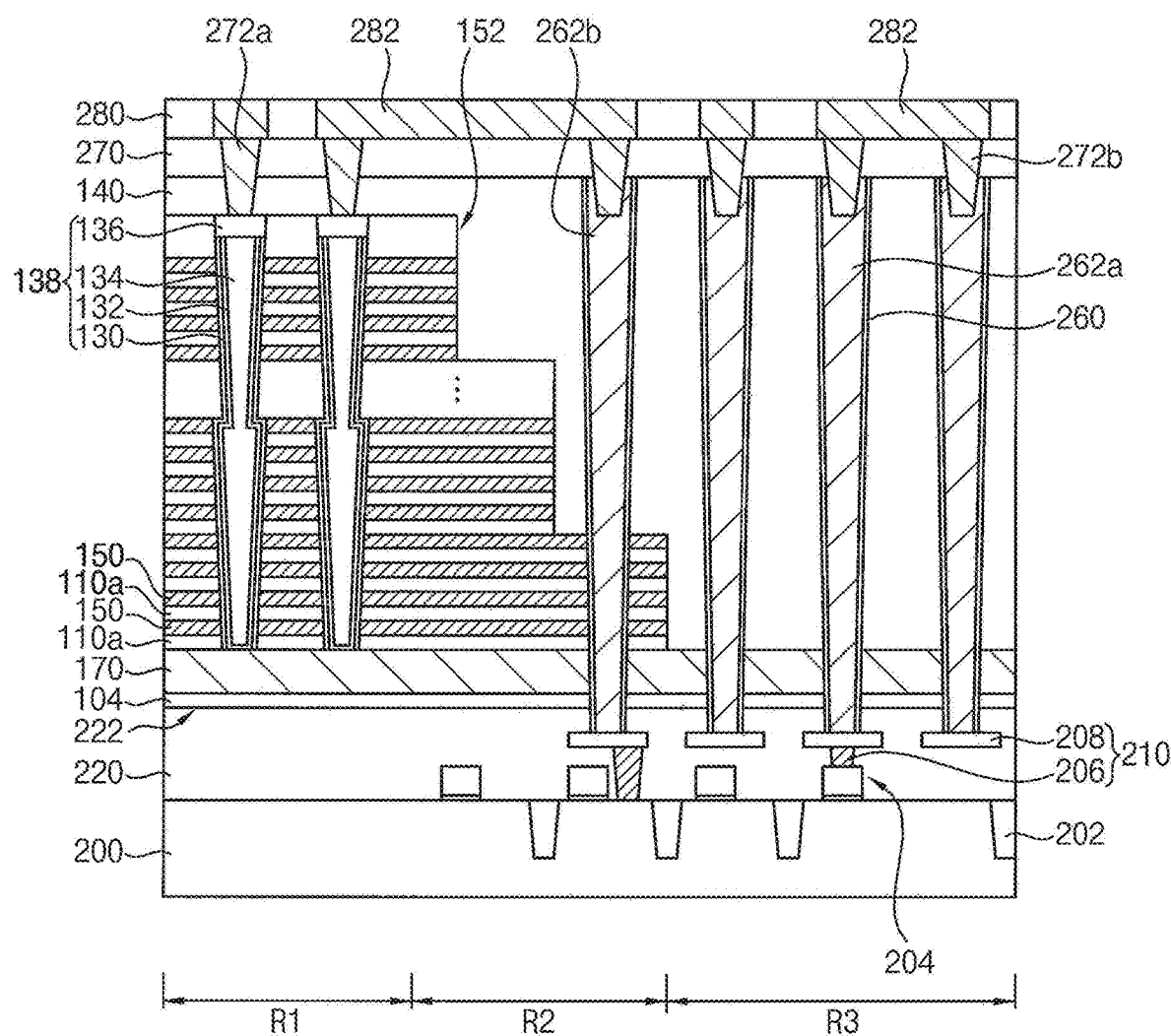

FIG. 22 is a cross-sectional view illustrating a vertical semiconductor device in accordance with an example embodiment.

The vertical semiconductor device may be the same as the vertical semiconductor device illustrated with reference to FIG. 1, except that the first substrate is replaced with a polysilicon layer.

Referring to FIG. 22, the polysilicon layer 170 may be provided instead of the first substrate 102 in the vertical semiconductor device illustrated with reference to FIG. 1. The channel structure 138 may contact an upper surface of the polysilicon layer 170.

Although not shown, similar to FIG. 18, the vertical semiconductor device may further include a lower conductive layer between the polysilicon layer 170 and the adhesive layer 104. In some example embodiments, the lower conductive layer may serve as a common source of the vertical memory cells.

Figure 23:
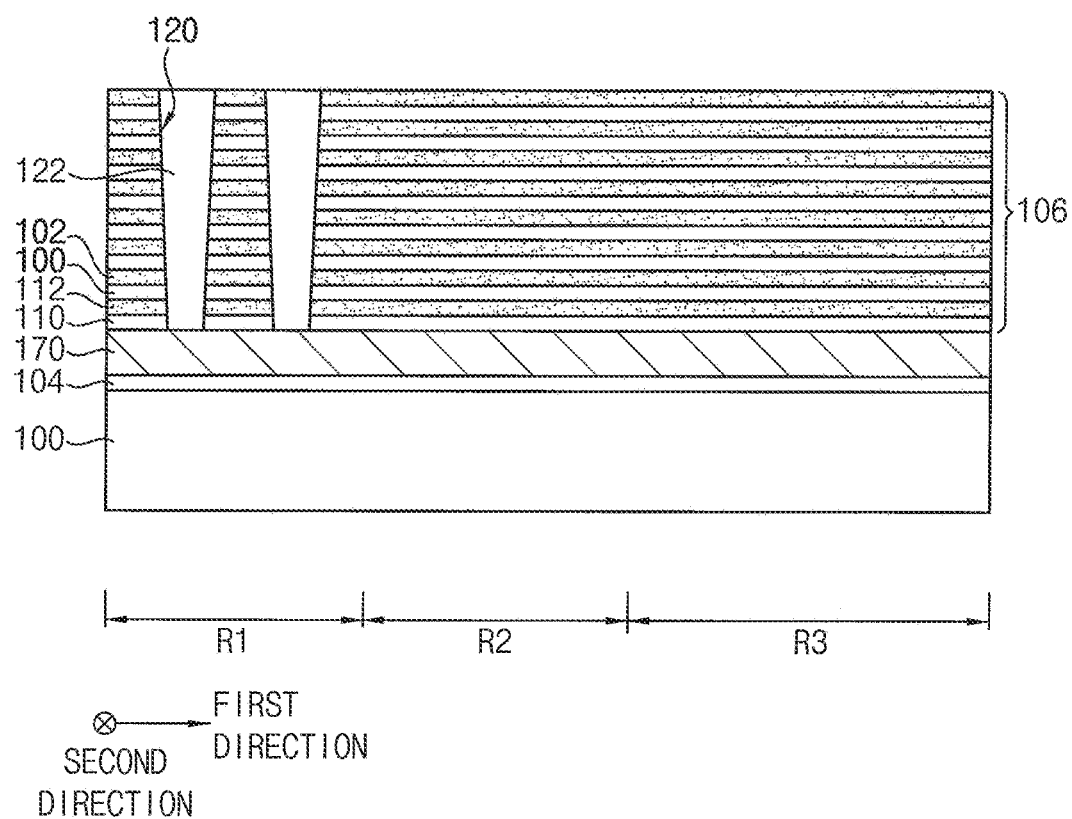
Figure 24:
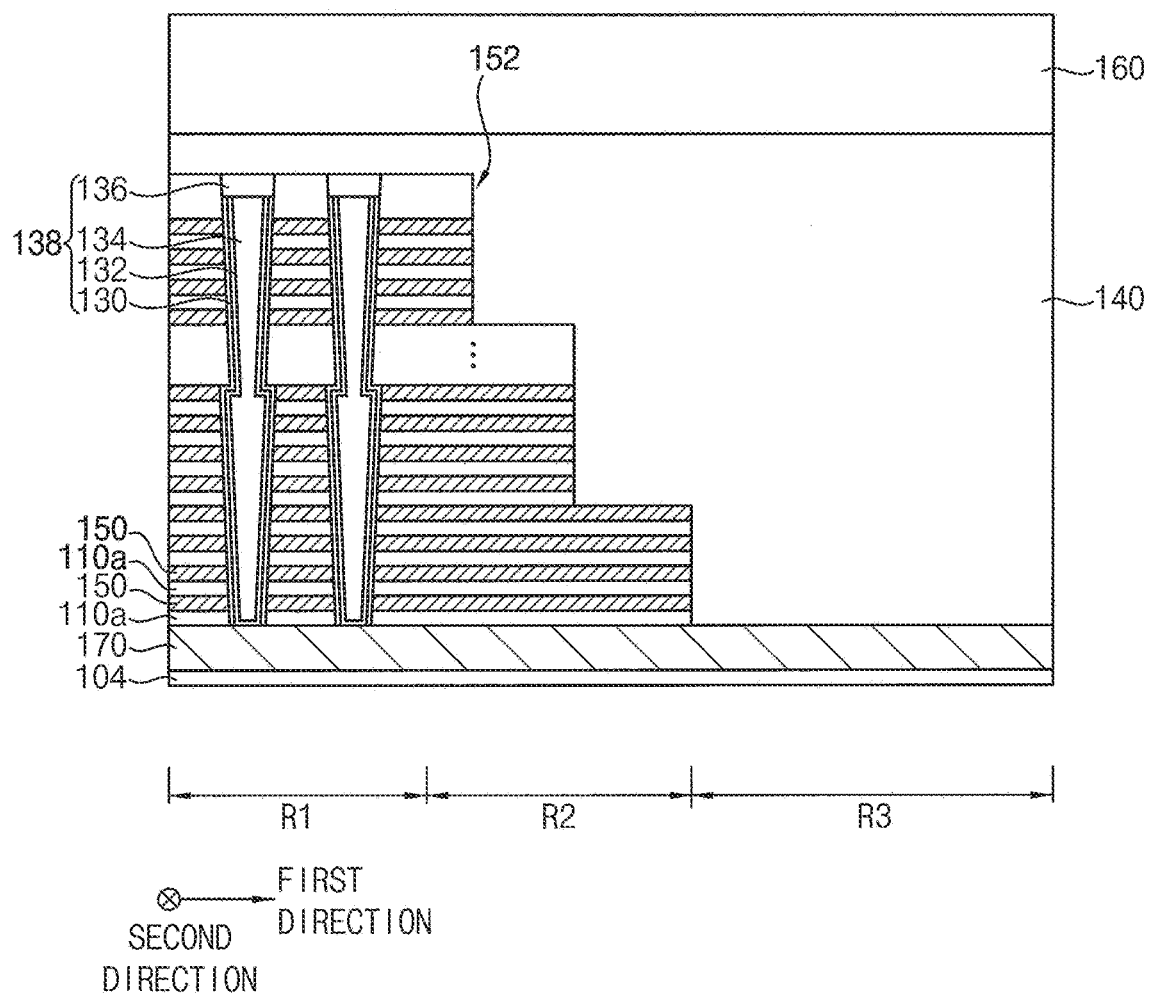

FIGS. 23 to 24 are plan views and cross-sectional views illustrating stages of a method of manufacturing a vertical semiconductor device in accordance with an example embodiment.

Referring to FIG. 23, the adhesive layer 104 and the polysilicon layer 170 may be sequentially formed on an upper surface of the preliminary first substrate 100.

The adhesive layer 104 may bond the substrates to each other in a subsequent process. The polysilicon layer 170 may serve as an upper substrate by subsequent processes.

In some example embodiments, although not shown, the adhesive layer 104, the lower conductive layer (103 in FIG. 18), and the polysilicon layer 170 may be sequentially formed on the upper surface of the preliminary first substrate 100.

The processes illustrated with reference to FIG. 3 may be performed on the polysilicon layer 170 in the same manner. Thus, the preliminary first mold structure 106 and the filling sacrificial pattern 122 may be formed.

Referring to FIG. 24, processes illustrated with reference to FIGS. 5 to 8 may be performed in the same manner.

Thereafter, the carrier substrate 160 may be attached to an upper surface of the first insulating interlayer 140 formed on the preliminary first substrate 100. The preliminary first substrate 100 may be removed by grinding a lower surface of the preliminary first substrate 100. When the preliminary first substrate 100 is removed, a lower surface of the adhesive layer 104 may be exposed.

Subsequently, processes illustrated with reference to FIGS. 10 to 14 may be performed in the same manner to manufacture the vertical semiconductor device illustrated with reference to FIG. 22.

Figure 25:
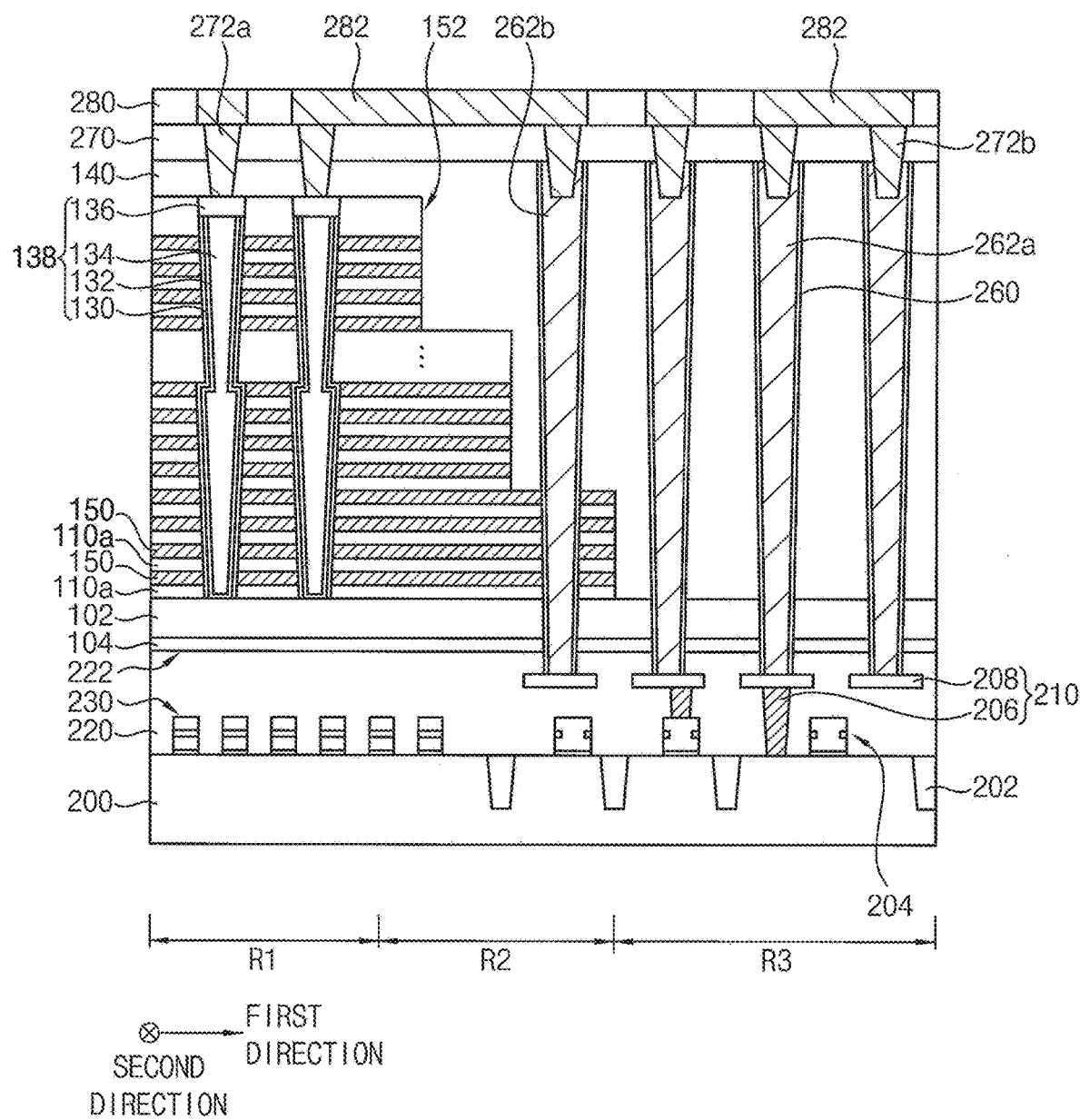

FIG. 25 is a cross-sectional view illustrating a vertical semiconductor device in accordance with an example embodiment.

The vertical semiconductor device may be the same as the vertical semiconductor device illustrated with reference to FIG. 1, except for second memory cells on a portion of the second substrate.

Referring to FIG. 25, the circuit patterns constituting a peripheral circuit on the second substrate 200, and the second memory cells 230 may be further included on the second substrate 200. The circuit patterns may include the first transistors 204 and the lower wirings 210.

At least some of the lower wirings 210 may be electrically connected to the peripheral circuits. Although not specifically illustrated, at least some of the lower wirings 210 may be electrically connected to the second memory cells 230.

In some example embodiments, the first transistors 204 constituting the peripheral circuit may be arranged on the second region R2 and the third region R3 of the first substrate 102. For example, the first transistors 204 may not be arranged on at least the first region R1.

In some example embodiments, the first transistors for constructing the peripheral circuit may be arranged on the third region R3 of the first substrate. For example, the first transistors may not be arranged on the first and second regions R1 and R2.

The second memory cells may be disposed at a portion of the second substrate 200 where the peripheral circuits are not formed. In some example embodiments, the second memory cells 230 may be arranged on the first region R1. In some example embodiments, the second memory cells 230 may be arranged on the first and second regions R1 and R2.

In some example embodiments, the second memory cells 230 may be a memory cells the same as the vertical memory cells formed on the first substrate 102. For example, the vertical memory cells and the second memory cells 230 may serve as NAND flash memory cells. In some example embodiments, the second memory cells 230 may have electrical characteristics the same as electrical characteristics of the vertical memory cells. In some example embodiments, the second memory cells 230 may have electrical characteristics different from electrical characteristics of the vertical memory cells. In this case, memory cells having different electrical characteristics may be included in one vertical semiconductor device.

In some example embodiments, the second memory cells 230 may be a memory different from the vertical memory cells formed on the first substrate 102. For example, the vertical memory cells may serve as NAND flash memory cells, and the second memory cells 230 may serve as NOR memory cells, DRAM cells, or SRAM cells.

Further, the circuit patterns formed on the second substrate 200 may further include peripheral circuits for operation of the second memory cells 230.

In some example embodiments, at least one of the peripheral circuits for operation of the vertical memory cell formed on the first substrate 102 and at least one of the peripheral circuits for operation of the second memory cells 230 may be shared with each other.

Although not shown, the second substrate in the vertical semiconductor devices in accordance with some example embodiments may be replaced with the second substrate including the circuit patterns constituting the peripheral circuit and the second memory cells illustrated with reference to FIG. 25.

Figure 26:
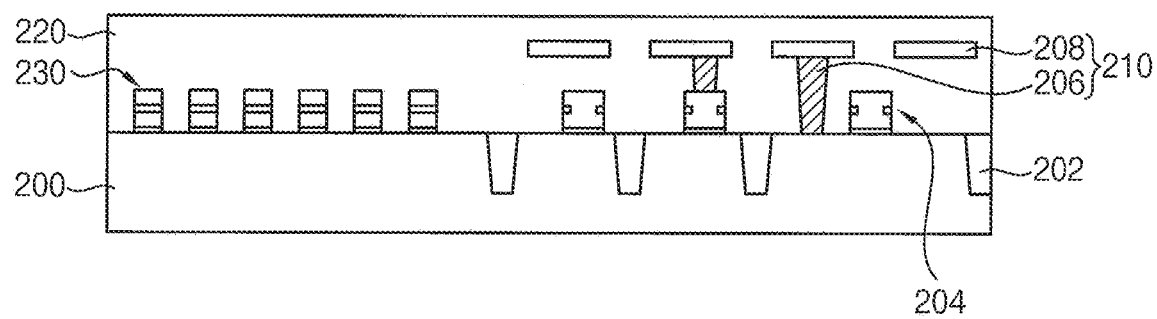
Figure 26:
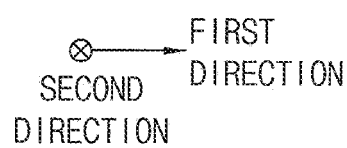

FIG. 26 is a cross-sectional view illustrating stages of a method of manufacturing a vertical semiconductor device in accordance with an example embodiment.

First, the processes illustrated with reference to FIGS. 3 to 9 may be performed in the same manner to form the vertical memory cells on the preliminary first substrate.

Referring to FIG. 26, the second substrate 200 may be provided. The first transistors 204 constituting a peripheral circuit may be formed on a portion of the second substrate 200 and second memory cells 230 may formed on another portion of the second substrate 200.

Some of the lower wirings 210 may be formed to be connected to the first transistors 204. Although not specifically illustrated, some of the lower wirings 210 may be formed to be connected to the second memory cells 230. Thereafter, a lower insulating interlayer 220 may be formed to cover the first transistors 204 and the second memory cells 230.

The second memory cells 230 may be disposed in a region where the first transistors 204 are not formed. In some example embodiments, the second memory cells 230 may be arranged on the first region R1. In some example embodiments, the second memory cells 230 may be arranged on the first and second regions R1 and R2.

The second memory cells 230 and the peripheral circuits may be formed on the second substrate 200 by the above process.

Next, the processes illustrated with reference to FIGS. 11 to 14 may be performed to manufacture the vertical semiconductor device illustrated with reference to FIG. 25.

Figure 27:
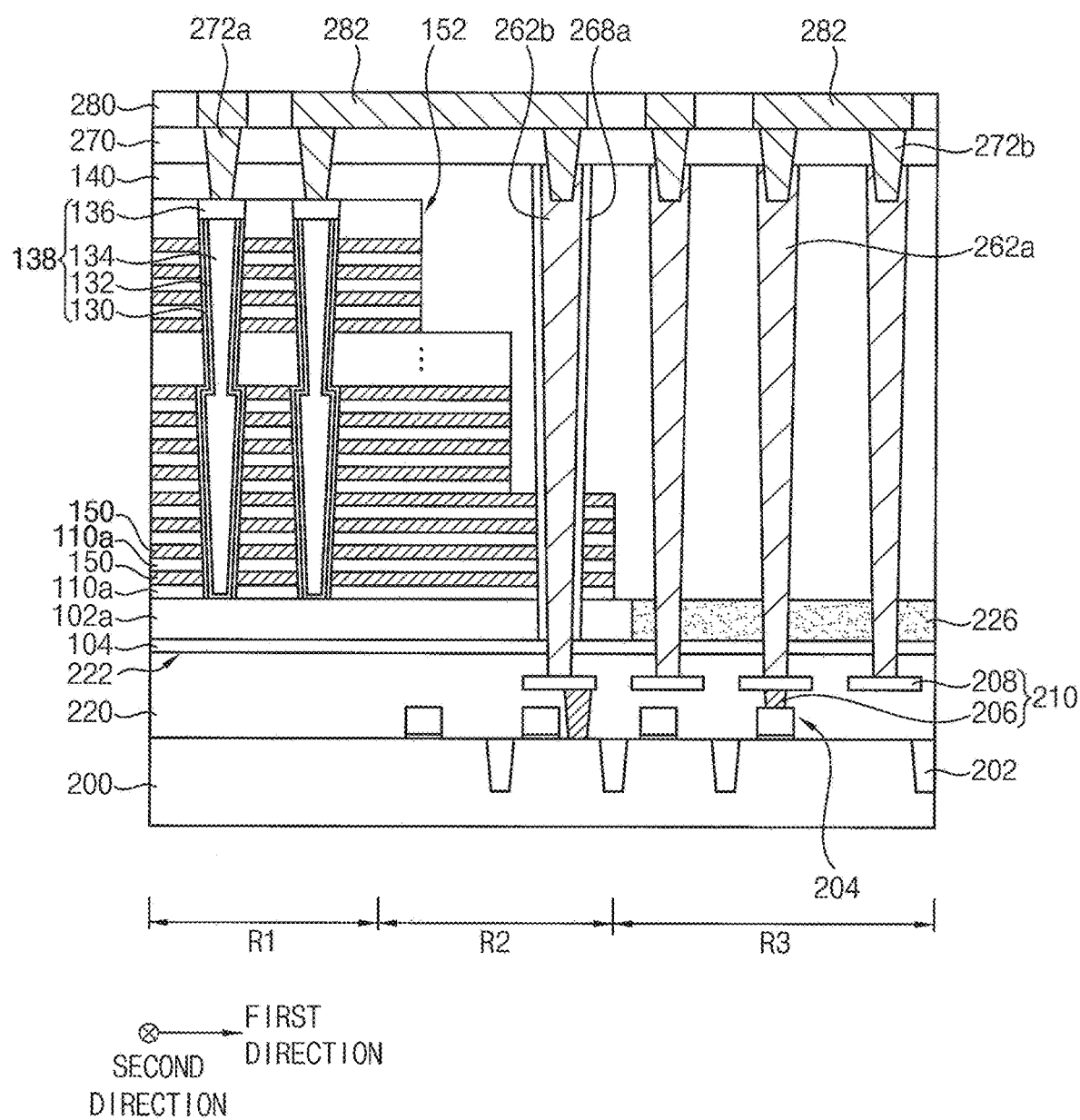

FIG. 27 is a cross-sectional view illustrating a vertical semiconductor device in accordance with an example embodiment.

The vertical semiconductor device may be the same as the vertical semiconductor device illustrated with reference to FIG. 1, except for shapes of a first substrate pattern and through via contacts.

Referring to FIG. 27, a first substrate pattern 102a may be provided. The first substrate pattern 102a may have a shape of the first substrate having a partially etched portion. A second isolation pattern 226 including an insulating material may be formed on a side of the first substrate pattern 102a. The first substrate pattern 102a may have a thickness of, e.g., about 0.1 μm to about 1 μm.

The first substrate pattern 102a may overlap a portion of the second substrate 200 below.

The first substrate pattern 102a may be disposed below the conductive pattern structure 152. Further, the second isolation pattern 226 may be disposed below a portion that is spaced apart from the conductive pattern structure 152 in the lateral direction. In some example embodiments, the second isolation pattern 226 may include silicon oxide or silicon nitride.

The first substrate pattern 102a and the second isolation pattern 226 may be arranged in a lateral direction, lower surfaces of the first substrate pattern 102a and the second isolation pattern 226 may be flat.

An adhesive layer 104 may be formed on the lower surfaces of the first substrate pattern 102a and the second isolation pattern 226.

In some example embodiments, the second isolation pattern 226 and the adhesive layer 104 may be formed of the same material, and thus merged into one structure.

First and second through via contacts 262a and 262b may penetrate through the first insulating interlayer 140 covering the conductive pattern structure 152, so that the first and second through via contacts 262a and 262b may contact upper surfaces of the lower pad patterns 208.

In some example embodiments, the first through via contacts 262a may be spaced from the conductive pattern structure 152 in a lateral direction. That is, the first through via contact 262a may penetrate through the first insulating interlayer 140, the second isolation pattern 226, the adhesive layer 104, and the lower insulating interlayer 220, so that the first through via contact 262a may contact the lower pad pattern 208. Therefore, the first through via contact 262a may not pass through the first substrate pattern 102a. That is, the first through via contact 262a may penetrate through only insulating materials.

In some example embodiments, an insulation spacer may not be formed on a sidewall of the first through via contact 262a.

In some example embodiments, the second through via contacts 262b may penetrate through a portion of the conductive pattern structure 152 having a staircase shape. The second through via contact 262b may penetrate through the first insulating interlayer 140, the portion of the conductive pattern structure 152 having the staircase shape, the first substrate pattern 102a, the adhesive layer 104, and a lower insulating interlayer 220, so that the second through via contact 262b may contact the lower pad pattern 208.

In some example embodiments, an insulation pattern 268a may be formed to be surrounded a sidewall of the second through via contact 262b. In some example embodiments, the insulation pattern 268a may have a spacer shape. For example, the insulation pattern 268a may be formed on the sidewall of the second through via contact 262b, and may contact the first insulating interlayer 140, the conductive pattern structure 152, and the first substrate pattern 102a. Thus, the second through via contact 262b, the first substrate pattern 102a, and the first conductive pattern 150 may be insulated from each other by the insulation pattern 268a.

In some example embodiments, the second through via contacts 262b may not be formed. In this case, only the first through via contacts 262a may be formed without the insulation spacers.

In some example embodiments, although not shown, insulation spacers may be formed on the sidewalls of each of the first and second through via contacts 262a and 262b. In this case, the first and second through via contacts 262a and 262b may have shapes the same as or substantially similar to ones shown in FIG. 1, respectively.

FIGS. 28 to 31 are plan views and cross-sectional views illustrating stages of a method of manufacturing a vertical semiconductor device in accordance with an example embodiment.

Figure 28:
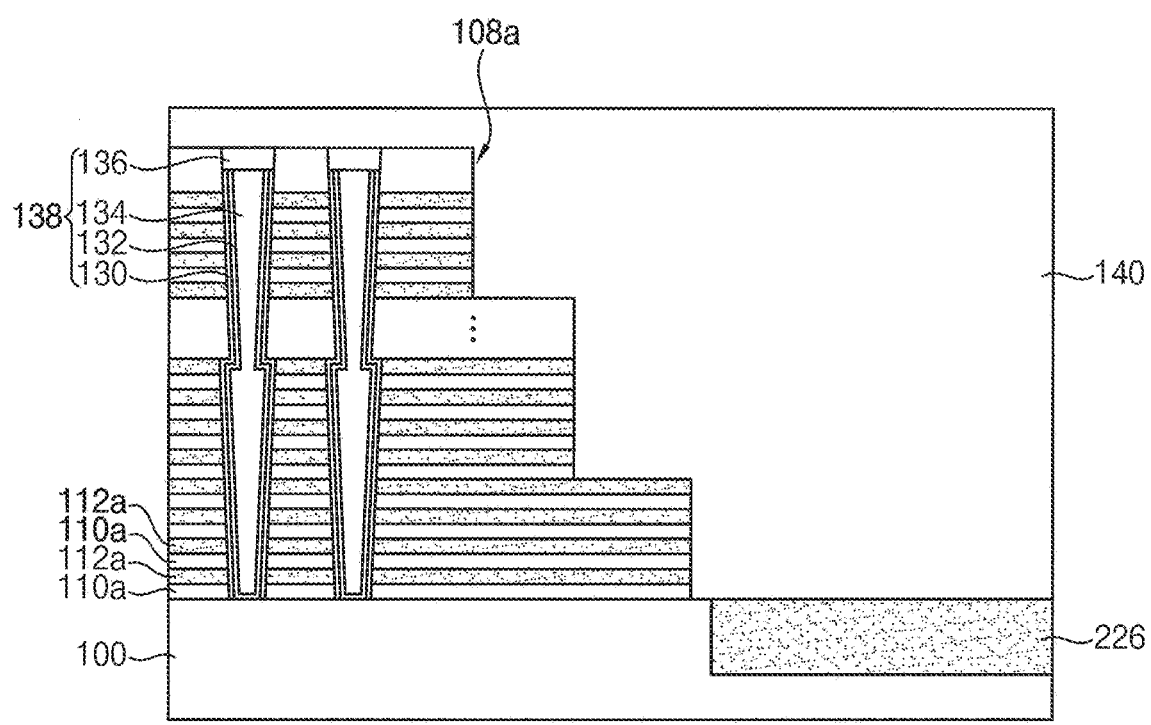
Figure 28:
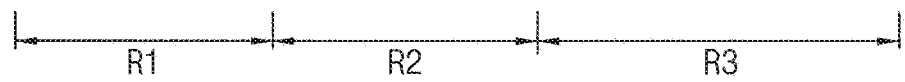

Referring to FIG. 28, an upper portion of the preliminary first substrate 100 may be partly etched to form a trench. An insulation layer may be formed to fill the trench, and the insulation layer may be planarized to form the second isolation layer 226.

The second isolation pattern 226 may be formed at a portion where the conductive pattern structure is not disposed in subsequent processes. That is, the second isolation pattern 226 may be formed to be spaced apart from conductive pattern structure in the lateral direction. The second isolation pattern 226 may include silicon oxide.

In some example embodiments, a height of the second isolation pattern 226 may be greater than a target thickness of the first substrate pattern.

Thereafter, the processes illustrated with reference to FIGS. 3 to 8 are performed in the same manner. Thus, the channel structure 138, the mold structure 108a, and the first insulating interlayer 140 may be formed on the preliminary first substrate 100 and the second isolation pattern 226.

Figure 29:
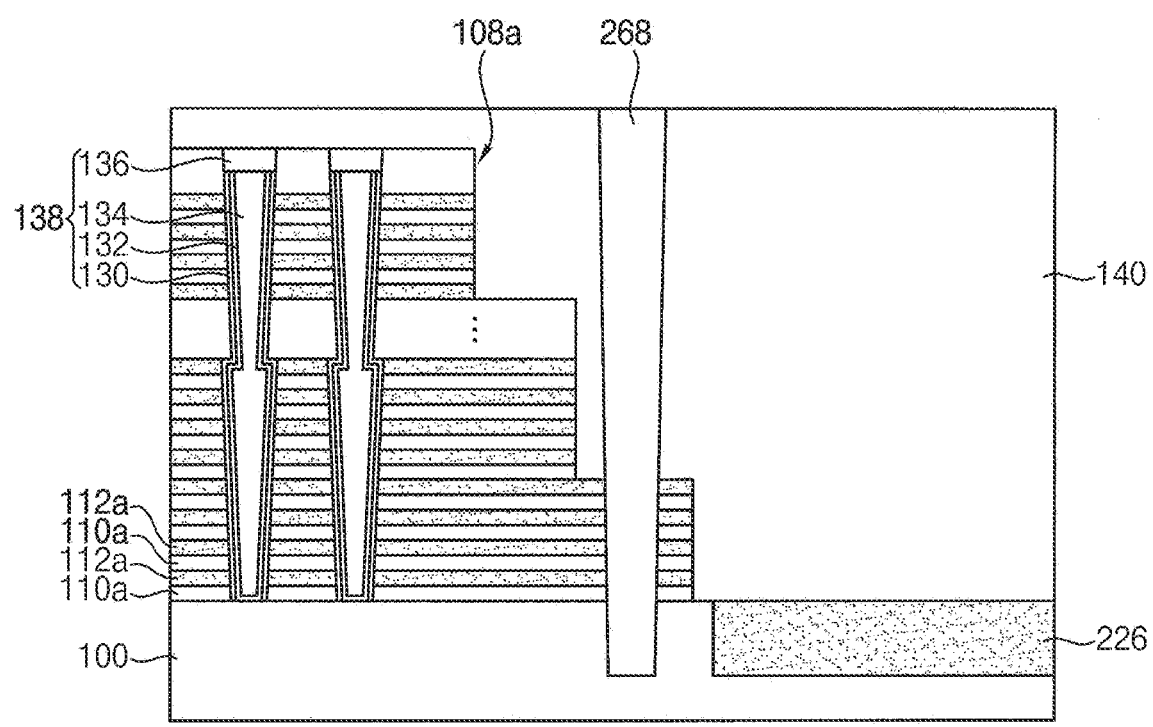

Referring to FIG. 29, the first insulating interlayer 140, the portion of the mold structure 108a having the staircase shape, and the upper portion of the preliminary first substrate 100 may be etched to form a hole. The hole may be formed at a portion where a second through via contact is formed in subsequent processes. As the second through via contact is formed in the hole in the subsequent process, the hole may be formed to have a size greater than a desired size of the second through via contact.

An insulation layers may be formed to fill the hole. The insulation layer may be planarized until an upper surface of the first insulating interlayer 140 may be exposed. Thus, a second filling insulation pattern 268 may be formed in the hole. The second filling insulation pattern 268 may include an insulation material having an etch selectivity with respect to the first sacrificial pattern 112a. In some example embodiments, the second filling insulation pattern 268 may include silicon oxide.

In some example embodiments, a height of the second filling insulation pattern 268 formed below the surface of the preliminary first substrate 100 may be greater than the target thickness of the first substrate pattern 102a to be implemented.

In some example embodiments, the second through via contact may not be formed in a subsequent process. In this case, the processes for forming the hole and the second filling insulation pattern may not be performed.

Figure 30:
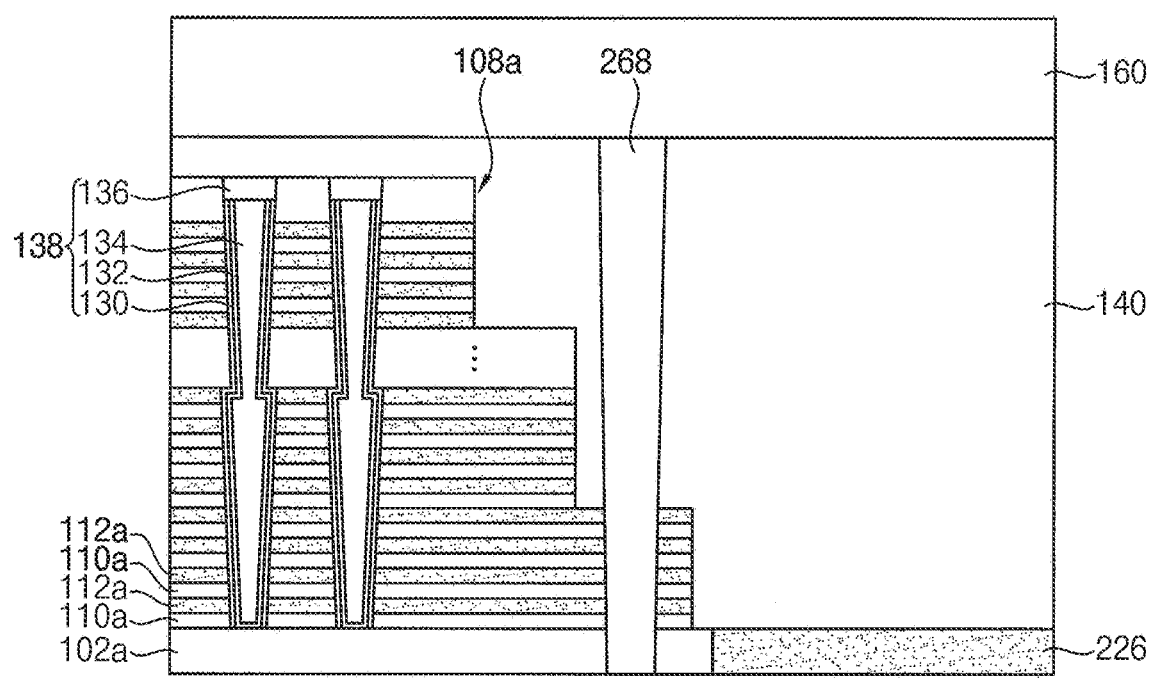
Figure 30:
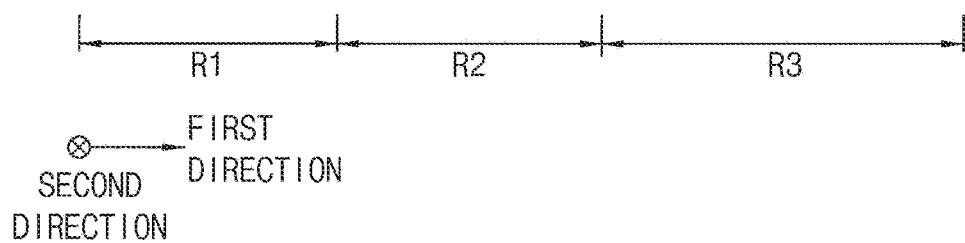

Referring to FIG. 30, a carrier substrate 160 may be attached to an upper surface of a first insulating interlayer 140 formed on the preliminary first substrate 100.

Thereafter, a lower surface of the preliminary first substrate 100 may be grinded to be exposed lower surfaces of the second isolation pattern 226 and the second filling insulation pattern 268. Thus, the preliminary first substrate 100 may be transformed into the first substrate pattern 102a.

When the grinding is performed, lower surfaces of the first substrate pattern 102a, the second isolation pattern 226, and the second filling insulation pattern 268 may be exposed.

Thereafter, the adhesive layer 104 (refer to FIG. 31) may be formed on the lower surfaces of the first substrate pattern 102a, the second isolation pattern 226, and the second filling insulation pattern 268.

Figure 31:
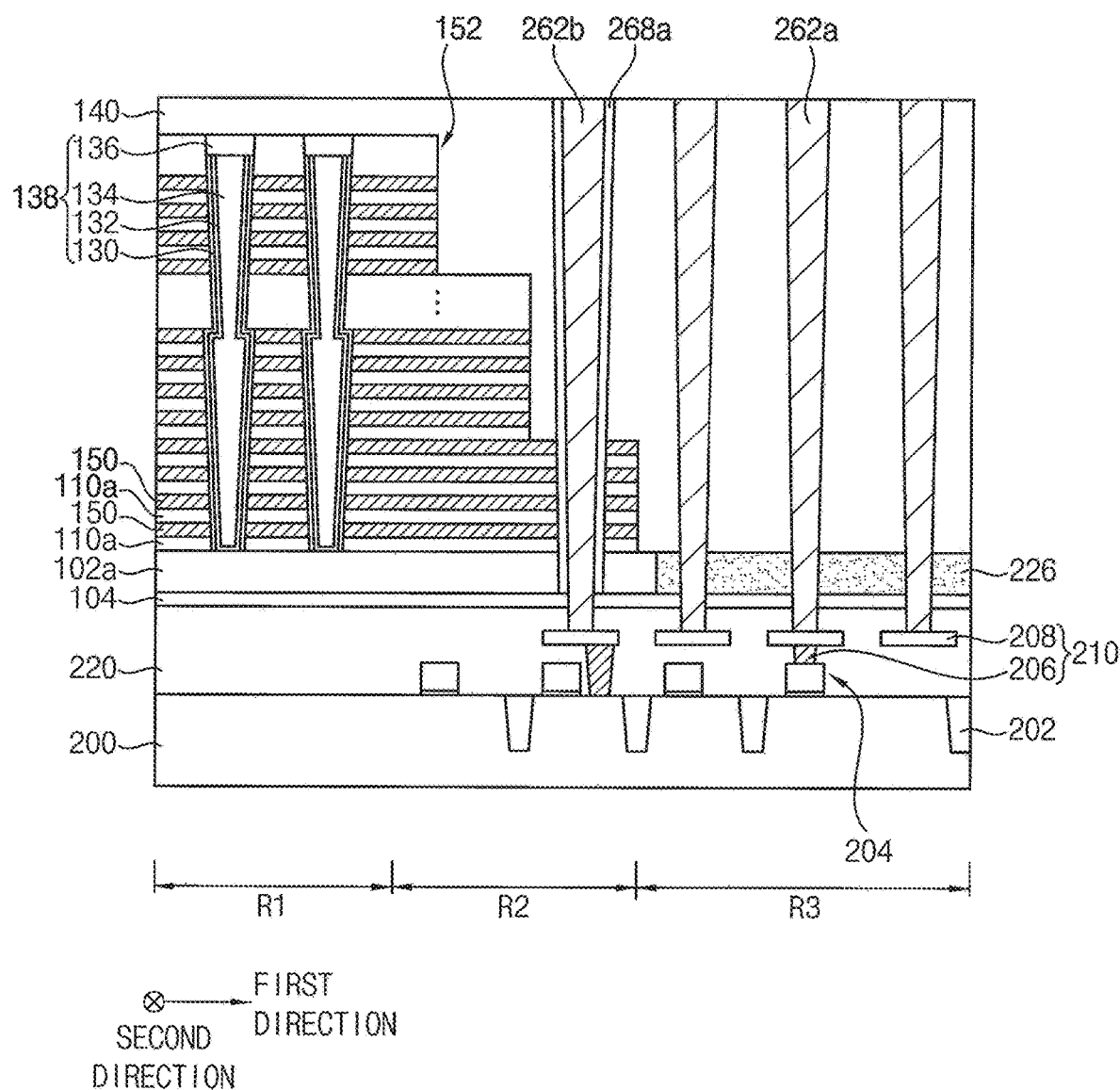

Referring to FIG. 31, first, the processes as illustrated with reference to FIGS. 10 and 11 may be performed. Therefore, the circuit patterns constituting the peripheral circuit may be formed on the second substrate 200, and the lower insulating interlayer 220 may be formed to cover the circuit patterns. The adhesive layer 104 on the lower surfaces of the first substrate pattern 102a, the second isolation pattern 226 and the second filling insulation pattern 268 and the lower insulating interlayer 220 on the second substrate 200 may be bonded to each other.

Thereafter, through holes 262a and 262b may be formed through the first insulating interlayer 140 so that a lower surface of each of the through holes may expose an upper surface of the lower pad pattern 208.

In some example embodiments, first through holes may be formed through the first insulating interlayer 140, the second isolation pattern 226, the adhesive layer 104, and the lower insulating interlayer 220 to expose the upper surface of the lower pad pattern 208.

Further, second through holes may be formed through the second filling insulation pattern 268, the adhesive layer 104 and the lower insulating interlayer 220 to expose the upper surface of the lower pad pattern 208. In an etching process for forming the second through hole, metal may not be etched but the insulating material may be etched. Thus, the second through hole may be easily formed by the etching process.

A conductive layer may be formed to fill the first and second through holes, and the conductive layer may be planarized to form the first through via contacts 262a and second through via contacts 262b. The first and second through via contacts 262a and 262b may include metal. In some example embodiments, a barrier layer may be further formed before forming the conductive layer.

The second through via contact 262b may be formed through the second filling insulation pattern 268. A portion of the second filling insulation pattern 268 may remain to surround a sidewall of the second through via contact 262b, so that the second filling insulation pattern 268 may be transformed into an insulation pattern 268a. That is, the insulation pattern 268a may have a shape of an insulation spacer surrounding the sidewall of the second through via contact.

In some example embodiments, the second filling insulation pattern 268 may not be formed. In this case, the second through via contact 262b may not be formed.

Subsequently, the processes as illustrated with reference to FIG. 14 may be performed to manufacture the vertical semiconductor device shown in FIG. 27.

Figure 32:
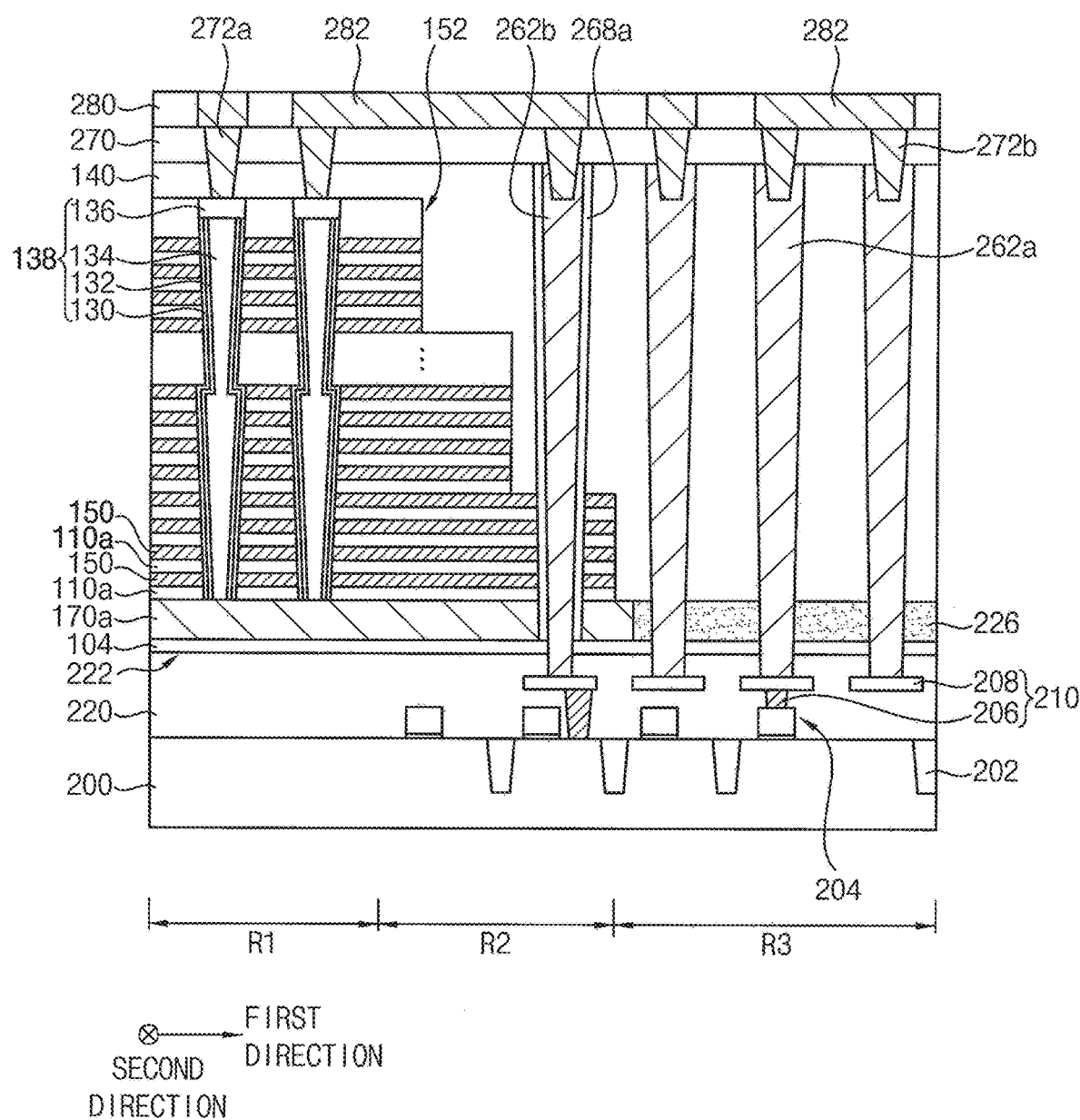

FIG. 32 is a cross-sectional view illustrating a vertical semiconductor device in accordance with an example embodiment.

The vertical semiconductor device may be the same as the vertical semiconductor device illustrated with reference to FIG. 17 except for the shapes of the polysilicon pattern and the through via contacts.

Referring to FIG. 32, the polysilicon pattern 170a and the second isolation pattern 226 adjacent to the polysilicon pattern 170a in the lateral direction may be provided instead of the polysilicon layer in the vertical semiconductor device illustrated with reference to FIG. 17. The polysilicon pattern 170a may be formed below the conductive pattern structure 152. Further, the first and second through via contacts 262a and 262b may be the same as the first and second through via contacts illustrated with reference to FIG. 27, respectively. Thus, the insulation pattern 268a surrounding the sidewall of the second through via contact 262b may be formed.

In some embodiments, the first and second through via contacts 262a and 262b may be the same as the first and second through via contacts 262a and 262b illustrated with reference to FIG. 17, respectively. That is, insulation spacers may be formed on the sidewalls of the first and second through via contacts.

Figure 33:
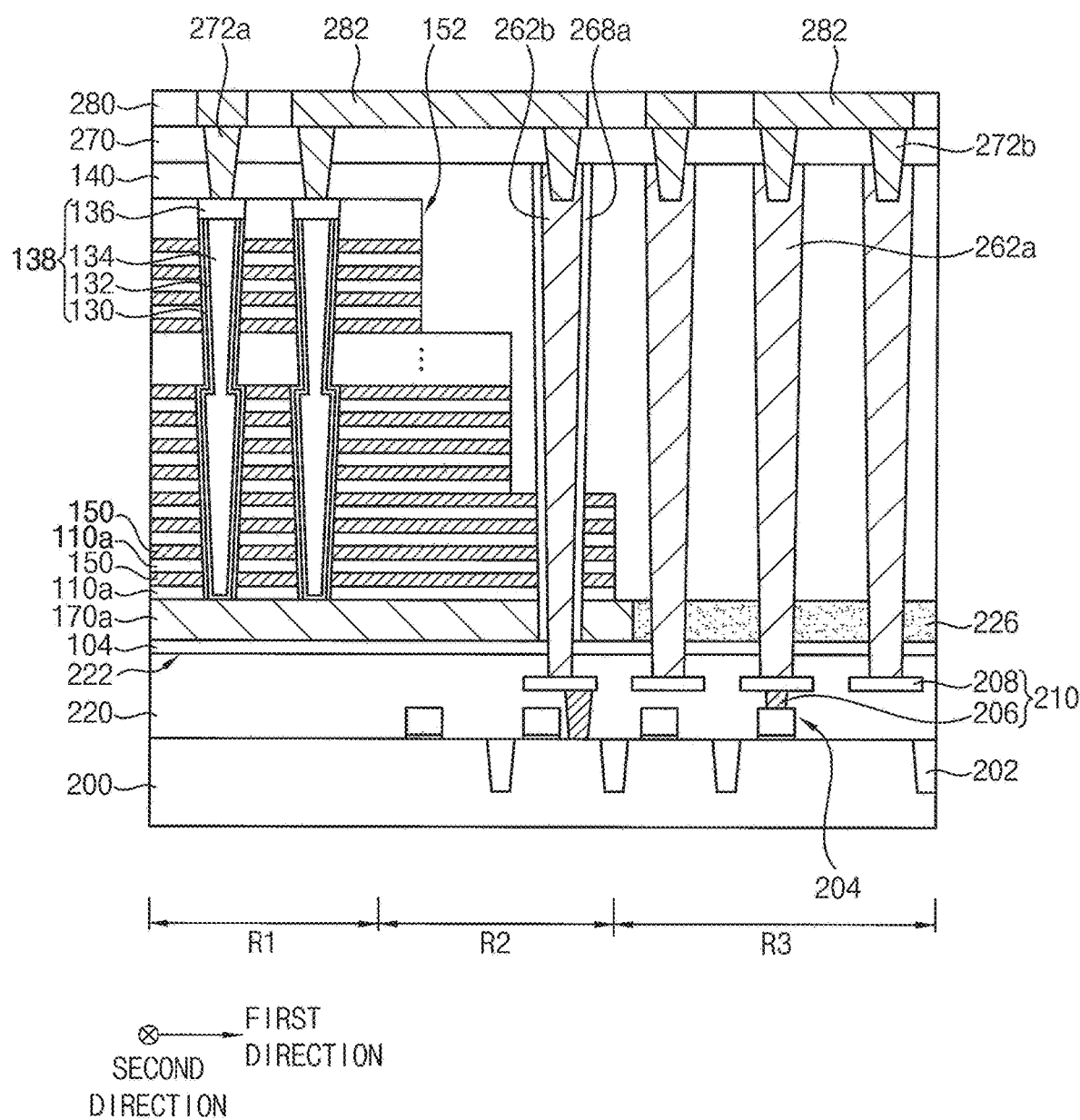

FIG. 33 is a cross-sectional view illustrating a vertical semiconductor device in accordance with an example embodiment.

The vertical semiconductor device may be the same as the vertical semiconductor device illustrated with reference to FIG. 22 except for the shapes of the polysilicon pattern and the through via contacts.

Referring to FIG. 33, the polysilicon pattern 170a and the second isolation pattern 226 adjacent to the polysilicon pattern 170a in the lateral direction may be provided instead of the polysilicon layer in the vertical semiconductor device illustrated with reference to FIG. 22. The polysilicon pattern 170a may be formed below the conductive pattern structure 152. Further, the first and second through via contacts 262a and 262b may be the same as the first and second through via contacts illustrated with reference to FIG. 27, respectively.

In some example embodiments, the first and second through via contacts 262a and 262b may be the same as the first and second through via contacts described with reference to FIG. 17. That is, insulation spacers may be formed on the sidewalls of the first and second through via contacts.

Figure 34:
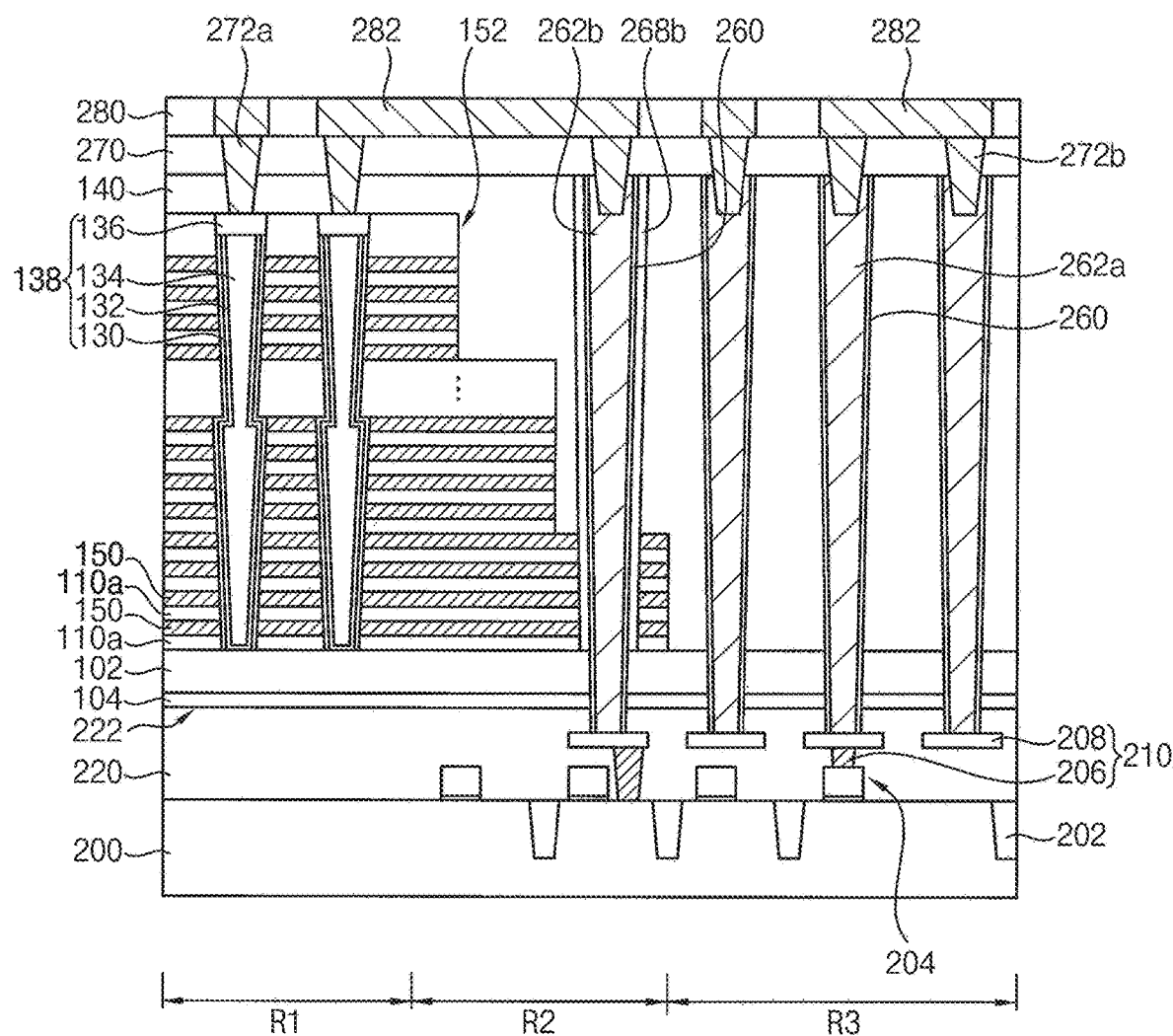

FIG. 34 is a cross-sectional view illustrating a vertical semiconductor device accordance with an example embodiment.

The vertical semiconductor device may be the same as the vertical semiconductor device described with reference to FIG. 1, except for an insulation pattern.

Referring to FIG. 34, in the vertical semiconductor device, the insulation pattern 268b may penetrate through a portion of the conductive pattern structure 152 having a staircase shape. In an example embodiment, the insulation pattern 268b may be formed on the first substrate 102. That is, the insulation pattern 268b may not pass through the first substrate 102.

The insulation spacer 260 may surround each of the first and second through via contacts 262a and 262b. The second through via contact 262b may penetrate through the insulation pattern 268b, and may penetrate through the first substrate 102, the adhesive layer 104 and the lower insulating interlayer. Thus, the second through via contact 262b may contact the lower pad pattern 208.

Thus, the second through via contact 262b formed on the first substrate 102 may be surrounded by the insulation spacer 260 and the insulation pattern 268b.

The vertical semiconductor device shown in FIG. 34 may be formed through processes identical or substantially similar to the processes illustrated with reference to FIGS. 3 to 14. However, the first insulating interlayer 140 may be formed by the processes illustrated with reference to FIG. 8, and then the filling insulation pattern 268 may be further formed through the first insulating interlayer 140 and the portion of the mold structure 108a having the staircase shape (refer to FIG. 7). The filling insulation pattern 268 may extend to an upper surface of the preliminary first substrate 100.

Thereafter, the second through via contact 262b may be formed through the filling insulation pattern. Thus, an insulation pattern 268b surrounding the sidewall of the second through via contact 262b may be formed. As only the insulating material is etched in the etching process for forming the second through via contact 262b, the etching process may be easily performed.

Figure 35:
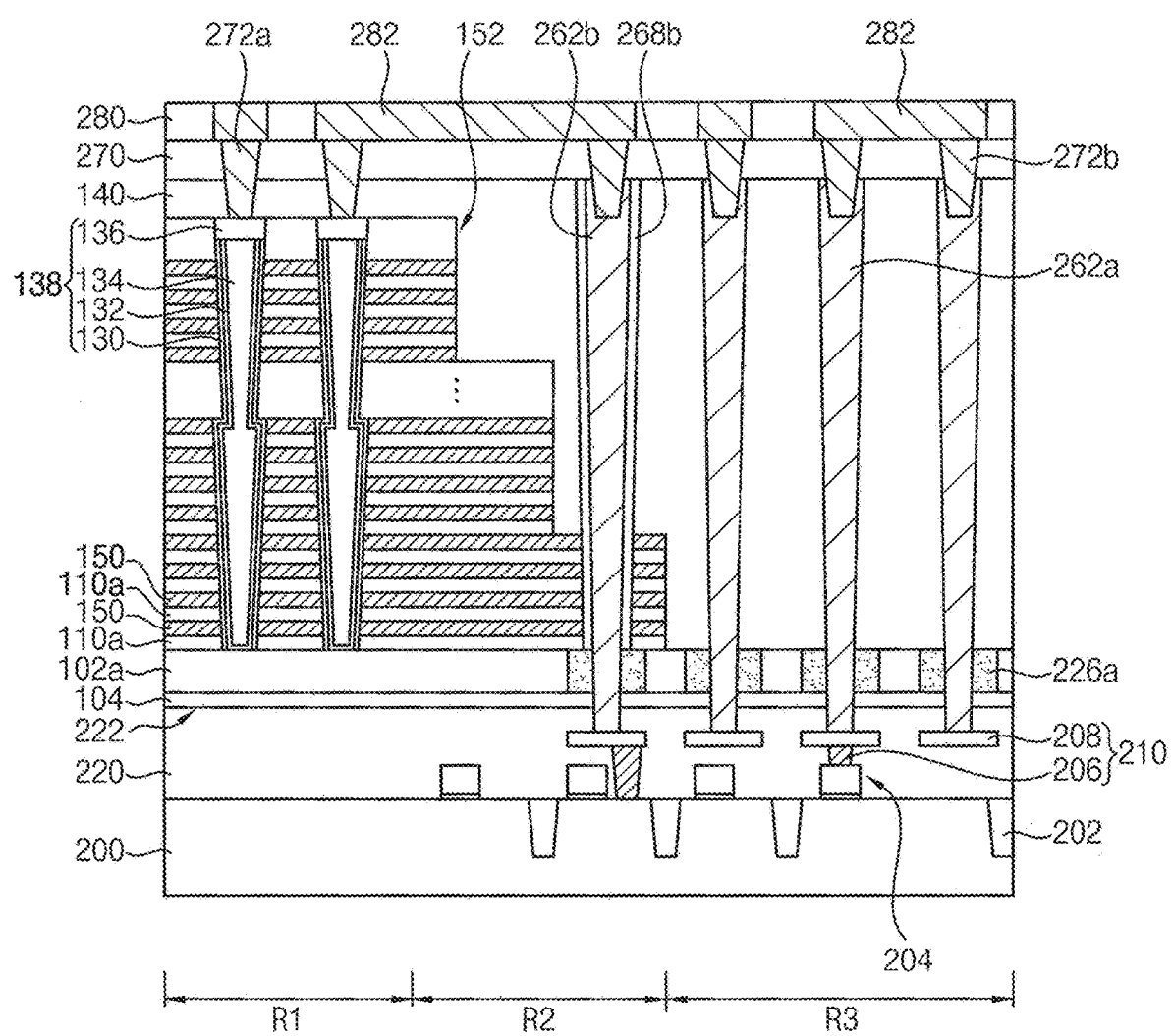

FIG. 35 is a cross-sectional view illustrating a vertical semiconductor device in accordance with an example embodiment.

The vertical semiconductor device may be the same as the vertical semiconductor device illustrated with reference to FIG. 27 except for the first substrate pattern and the insulation pattern.

Referring to FIG. 35, in the vertical semiconductor device, the first substrate pattern 102a may have etched portions at which the first and second through via contacts 262a and 262b may be subsequently formed. That is, the etched portions of the first substrate pattern 102a of portions, which is used for forming the first and second through via contacts 262a and 262b, may include openings. Widths of the openings may be greater than widths of the first and second through via contacts 262a and 262b. Second isolation patterns 226a may be formed in the openings, respectively.

In the vertical semiconductor device, the insulation pattern 268b may be formed through the portion of the conductive pattern structure 152 having the staircase shape. In some example embodiments, the insulation pattern 268b may be formed on some of the second isolation patterns 226a.

An insulation spacer may not be formed on sidewalls of the first and second through via contacts 262a and 262b. The first and second through via contacts 262a and 262b may be formed through the second isolation pattern 226a, and may contact the lower pad patterns 208. Thus, the first and second through via contacts 262a and 262b may not contact the first substrate pattern 102a.

Also, the second through via contact 262b may penetrate the insulation pattern 268b. Thus, the insulation pattern 268b may surround a sidewall of the second through via contact 262b.

The vertical semiconductor device shown in FIG. 35 may be formed through processes identical or substantially similar to the processes illustrated with reference to FIGS. 28 to 32.

However, in the forming the second isolation pattern 226a on the preliminary first substrate 100 illustrated with reference to FIG. 28, the second isolation pattern 226a may be formed at portions for forming the first and second through via contacts 262a and 262b. Further, in the forming the second filling insulation pattern illustrated with reference to FIG. 29, the second filling insulation pattern may be formed so as not to penetrate the preliminary first substrate 100. That is, the second filling insulation pattern may be formed on the second isolation pattern 226a. Thus, the insulation pattern 268b surrounding the sidewall of the through via contact 262b may be formed on the second isolation pattern 226a by a subsequent process.

Figure 36:
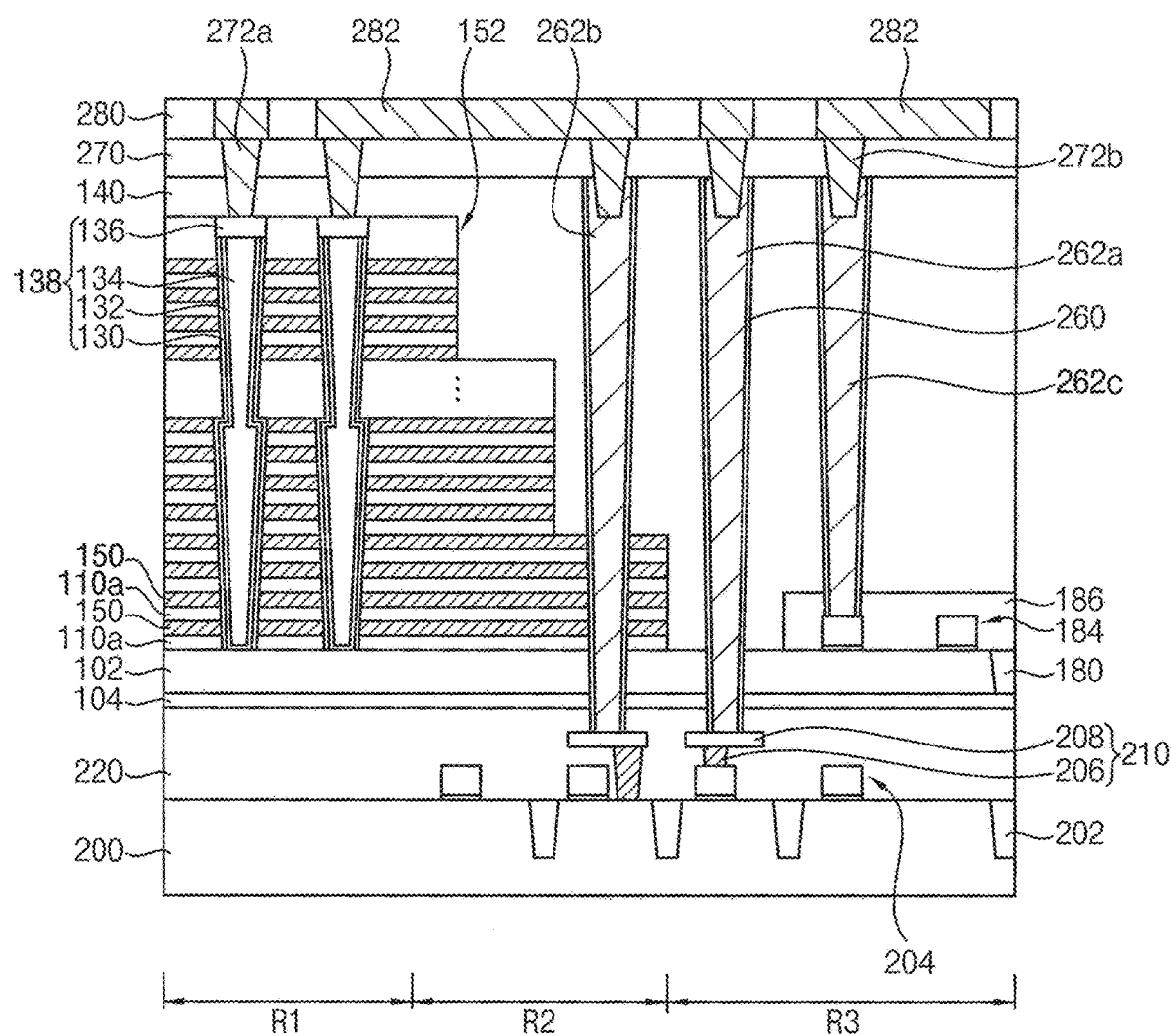

FIG. 36 is a cross-sectional view illustrating a vertical semiconductor device in accordance with an example embodiment.

The vertical semiconductor device may be the same as the vertical semiconductor device illustrated with reference to FIG. 1, except that peripheral circuits may be further formed on the third region of the first substrate.

Referring to FIG. 36, first circuit patterns 184 constituting a portion of the peripheral circuits may be formed on a third region R3 of the first substrate 102. In some example embodiments, the first circuit patterns 184 may include transistors. Further, a first isolation pattern 180 may be formed in the third region R3 of the first substrate 102. A lower insulation pattern 186 may be further formed to cover the first circuit patterns 184.

Circuit patterns constituting another portion of the peripheral circuits may be formed on the second substrate 200, as illustrated with reference to FIG. 1.

Further, some of the through via contacts 262c may be electrically connected to the first circuit patterns 184.

Peripheral circuits may be formed on the upper surface of the second substrate 200 and the third region of the first substrate 102, respectively.

In some example embodiments, although not shown, circuit patterns constituting the peripheral circuit and the second memory cells 230 (Refer to FIG. 25) may be formed on the second substrate 200, as illustrated with reference to FIG. 25.

Figure 37:
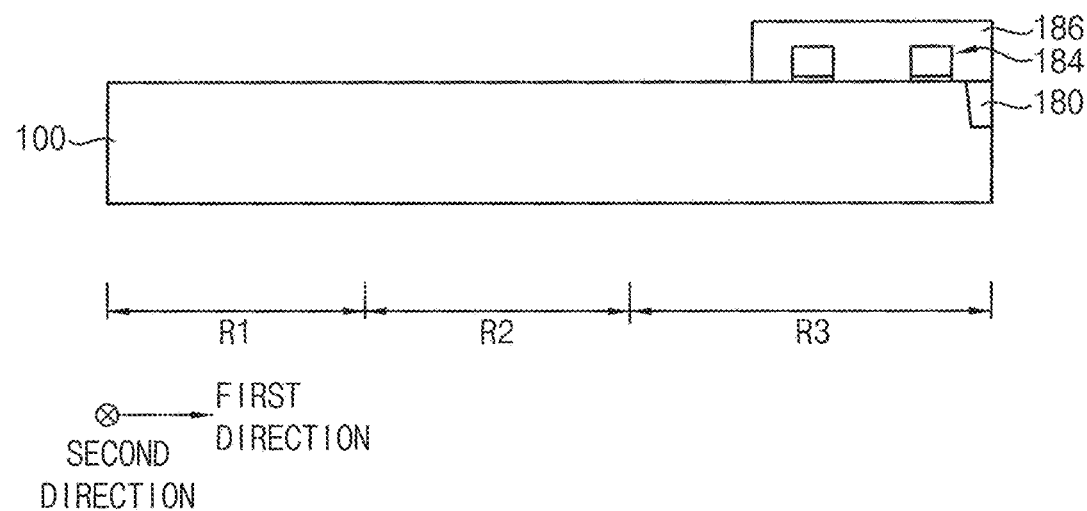
Figure 38:
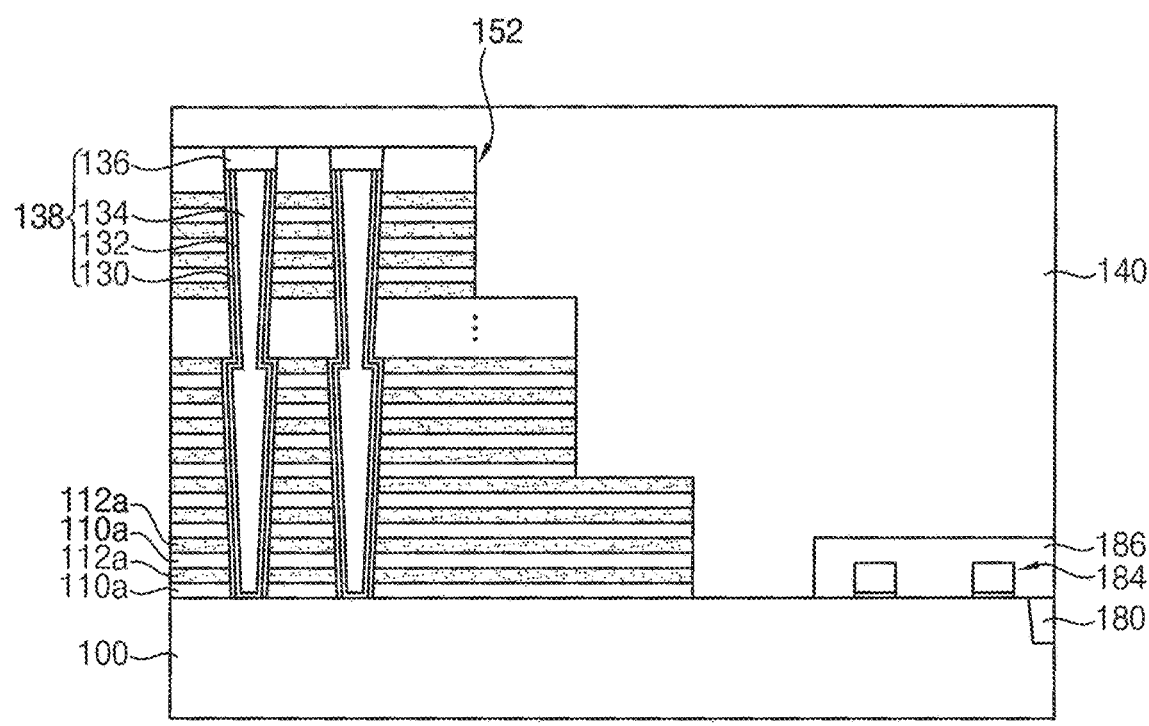
Figure 38:
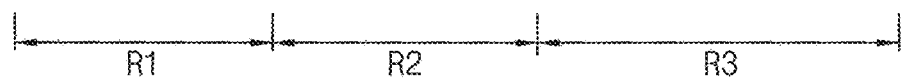

FIGS. 37 and 38 are cross-sectional views illustrating stages of a method of manufacturing a vertical semiconductor device in accordance with some example embodiments.

Referring to FIG. 37, a first isolation pattern 180 may be formed in a third region R3 of the preliminary first substrate 100. First circuit patterns (or a second peripheral circuit) 184 constituting a portion of the peripheral circuit may be formed on the third region R3 of the preliminary first substrate 100. The first circuit patterns 184 may include transistors. The lower insulation pattern 186 may be formed to cover the first circuit patterns 184.

That is, the first circuit patterns 184 constituting a portion of the peripheral circuit may be formed on the preliminary first substrate 100 where the conductive pattern structure 152 is not be formed.

Thereafter, the processes illustrated with reference to FIGS. 3 to 8 may be performed to manufacture the structure shown in FIG. 38.

Subsequently, the processes illustrated with reference to FIGS. 9 to 14, the semiconductor device shown in FIG. 36. In this case, some of the through via contacts 262c may be electrically connected to the first circuit patterns.

Figure 39:
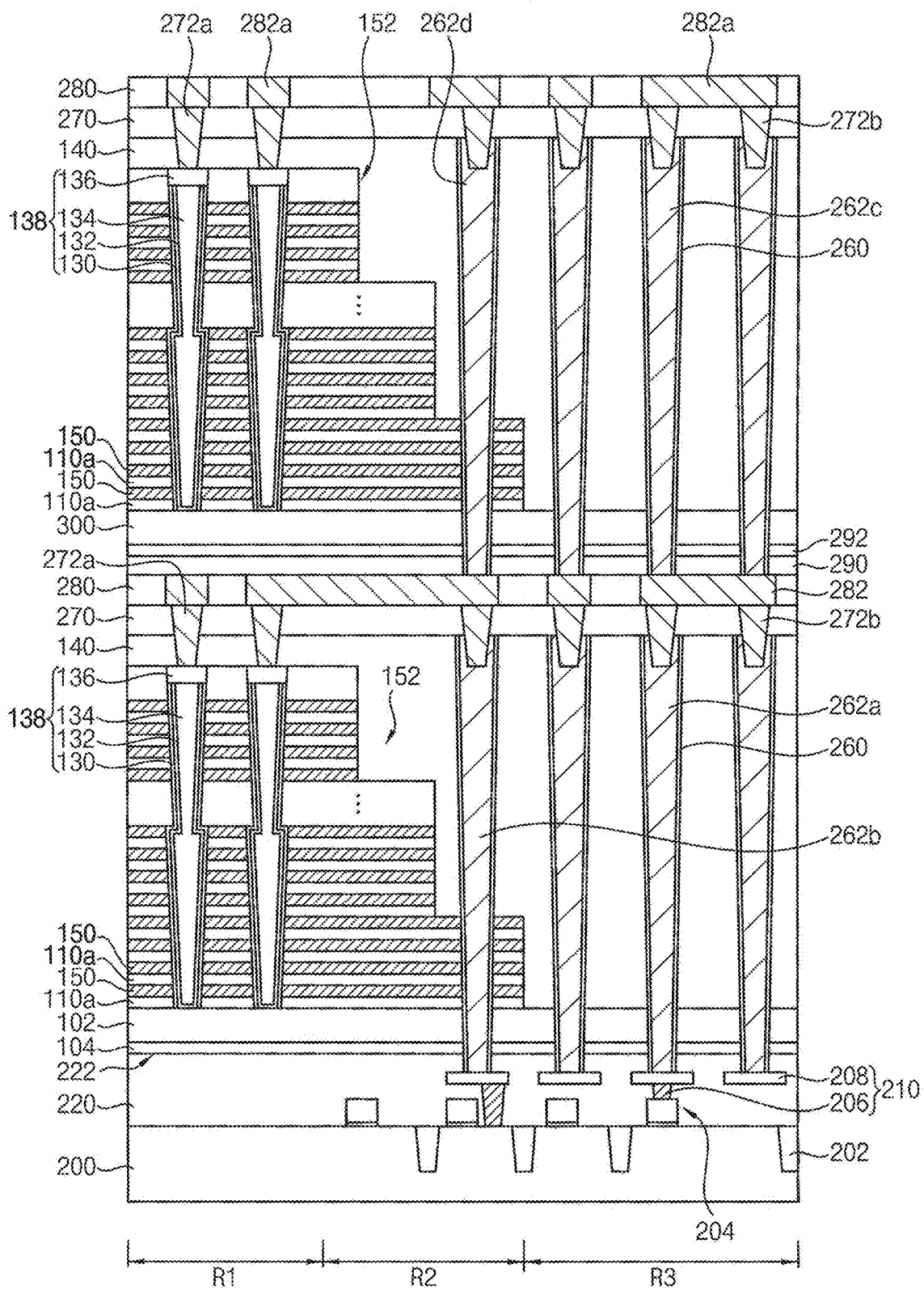

FIG. 39 is a cross-sectional view illustrating a vertical semiconductor device in accordance with an example embodiment.

The vertical semiconductor device of FIG. 39 may include the vertical semiconductor device illustrated with reference to FIG. 1 and a third substrate attached on the vertical semiconductor device and having vertical memory cells.

Referring to FIG. 39, a third insulating interlayer 280 may be formed on the vertical memory cells on the first substrate 102, as the vertical semiconductor device illustrated with reference to FIG. 1. The lower surface of the third substrate 300 may be attached on the third insulating interlayer 280. Vertical memory cells may be formed on an upper surface of the third substrate 300 that is opposite to a lower surface of the third substrate 300.

In some example embodiments, an upper insulating interlayer 290 may be formed to cover the third interlayer insulating layer 280 and the upper wirings 282 on the first substrate 102. An upper adhesive layer 292 may be formed on the upper insulating interlayer 290. The third substrate 300 on which the vertical memory cells are formed may be mounted on the upper adhesive layer 292. Thus, the lower surface of the third substrate 300 may be attached on the upper adhesive layer 292

In some example embodiments, the structure formed on the upper surface of the third substrate 300 may be the same as or substantially similar to the structure formed on the first substrate 102 illustrated with reference to FIG. 1. For example, the vertical memory cells, the first and second via contacts 262c and 262d, the first and second upper contacts 272a and 272b and the upper wirings 282a may be formed on the third substrate 300.

Some of the first and second through via contacts 262c and 262d formed on the third substrate 300 may be electrically connected to some of the first and second through via contacts 262a, and 262b formed on the first substrate 102, respectively. In some example embodiments, the first and second through via contacts 262c and 262d formed on the third substrate 300 may be electrically connected to the upper wirings 282 formed on the first substrate 102.

In some example embodiments, the plurality of substrates on which the vertical memory cells are formed may be further stacked.

As described above, the vertical semiconductor device may have a structure in which a plurality of substrates, each of which has vertical memory cells thereon, may be stacked. Thus, a highly integrated memory device may be provided.

In some example embodiments, a vertical semiconductor device may have a structure in which a third substrate, on which additional vertical memory cells are formed, is further attached to the vertical semiconductor device in accordance with some example embodiments described above.

Figure 40:
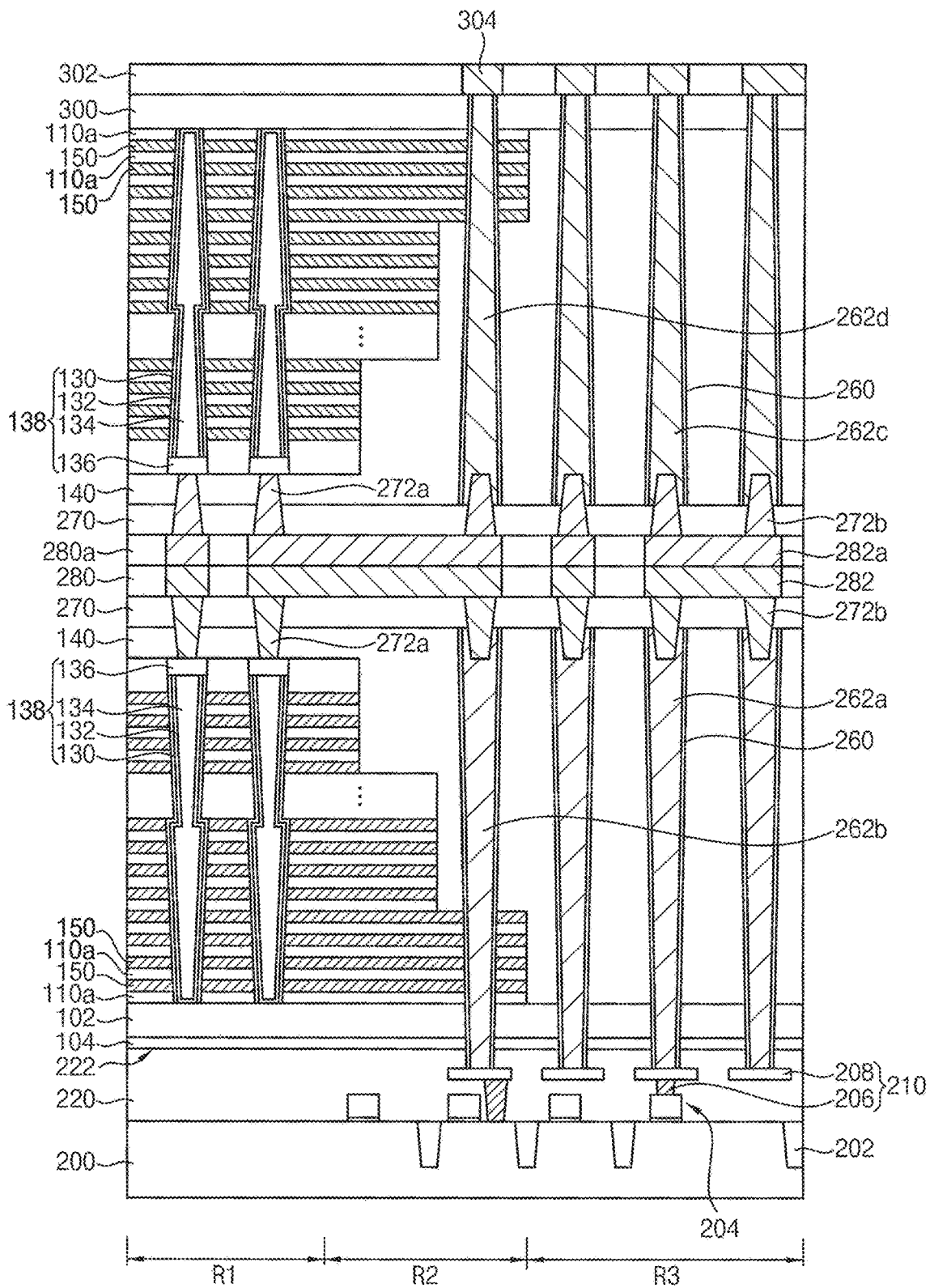

FIG. 40 is a cross-sectional view illustrating a vertical semiconductor device in accordance with an example embodiment.

The vertical semiconductor device may have a structure in which a third substrate, on which vertical memory cells are formed, is further attached to the vertical semiconductor device described with reference to FIG. 1.

Referring to FIG. 40, a third insulating interlayer 280 may be formed on the vertical memory cells on the first substrate 102, as the vertical semiconductor device illustrated with reference to FIG. 1

Vertical memory cells may be formed on a first surface of the third substrate 300, and the upper insulating interlayer 280a may be formed to cover the vertical memory cells. The third insulating interlayer 280 formed on the first substrate 102 and the upper insulating interlayer 280a formed on the third substrate 300 may be attached to each other.

In some example embodiments, the structure formed on the third substrate 300 may be the same as or substantially similar to the structure formed on the first substrate 102 illustrated with reference to FIG. 1. For example, the vertical memory cell, the first and second through via contacts 262c and 262d, the first and second upper contacts 272a and 272b, the upper wiring and the upper insulating interlayer 280a may be formed on the third substrate 300.

The third insulating interlayer 280 on the vertical memory cells formed on the first substrate 102 and the upper insulating interlayer 280a on the vertical memory cells formed on the third substrate 300 may be attached to each other, so that the vertical memory cells formed on the substrate 300 may have an inverted shape of the vertical memory cells formed on the first substrate 102.

In some example embodiments, the upper wiring 282 formed in the third insulating interlayer 280 of the first substrate 102 and the upper wiring 282a formed in the upper insulating interlayer 280a of the third substrate 280 may be attached to each other. Thus, the vertical memory cells formed on the first substrate 102 and the vertical memory cells formed on the third substrate 300 may have a symmetrical shape with respect to an attached portion therebetween. Further, the third substrate 300 may be disposed on the vertical memory device.

The first and second through via contacts 262c and 262d may be exposed at a second surface of the third substrate 300 that is opposite to the first surface thereof. That is, the first and second through via contacts 262c and 262d may be exposed at the surface of the third substrate 300 toward an uppermost portion of the vertical memory device.

An upper insulation layer 302 and an upper pad 304 may be formed on the third substrate 300. In some example embodiments, the upper pad 304 may be electrically connected to at least a portion of the first and second through via contacts 262c and 262d.

In some example embodiments, the plurality of substrates on which the vertical memory cells are formed may be further stacked in the same manner.

As described above, the vertical semiconductor device may have a structure in which a plurality of substrates on which vertical memory cells are formed are stacked. Thus, a highly integrated memory device may be provided.

In some example embodiments, the vertical semiconductor device described above may have a structure including a third substrate on which additional vertical memory cells are formed.

The foregoing is illustrative of some example embodiments and is not to be construed as limiting thereof. Although a few some example embodiments have been described, those skilled in the art will readily appreciate that many modifications are possible in the described example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function as well as structural equivalents and equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical semiconductor device, comprising:
   a plurality of vertical memory cells on an upper surface of a first substrate;
   a first insulating interlayer covering the vertical memory cells on the first substrate;
   an isolation pattern including an insulation material, the isolation pattern being in the first substrate;
   an adhesive layer on a lower surface of the first substrate that is opposite to the upper surface of the first substrate;
   a second substrate having first peripheral circuits thereon;
   a lower insulating interlayer on the second substrate; and
   a plurality of wiring structures electrically connecting the vertical memory cells and the first peripheral circuits,
   wherein a lower surface of the adhesive layer and an upper surface of the lower insulating interlayer are in contact with each other,
   wherein each of the wiring structures include,
      one of a plurality of through via contacts passing through the first insulating interlayer and the isolation pattern, and contacting a lower string of a corresponding one of the first peripheral circuits, and
      an upper wiring electrically connected to the one of the through via contacts,
   wherein the lower surface of the adhesive layer and the upper surface of the lower insulating interlayer serve as a bonding interface, and
   wherein voids are irregularly provided at the bonding interface.

2. The vertical semiconductor device of claim 1, wherein the first substrate includes a single crystal semiconductor material or polysilicon.

3. The vertical semiconductor device of claim 1, wherein the adhesive layer includes at least one of Ga, GaN, copper, or a compound containing silicon.

4. The vertical semiconductor device of claim 1, further comprising:
   an insulation spacer surrounding a side wall of at least one of the through via contacts.

5. The vertical semiconductor device of claim 1, further comprising:
   an insulation pattern surrounding a side wall of at least one of the through via contacts.

6. The vertical semiconductor device of claim 1, wherein the through via contacts are not in direct contact with the vertical memory cells.

7. The vertical semiconductor device of claim 1, wherein the vertical memory cells comprise:
   first conductive patterns being apart from each other in a direction perpendicular to the first substrate; and
   channel structures passing through the first conductive patterns, the channel structures electrically connected to the first substrate.

8. The vertical semiconductor device of claim 1, further comprising:
   a lower conductive layer between the first substrate and the adhesive layer, the lower conductive layer vertically separating the first substrate from the adhesive layer.

9. The vertical semiconductor device of claim 1, wherein the first substrate overlaps the upper surface of the second substrate, and
   the adhesive layer and the lower insulating interlayer are between the first substrate and the second substrate.

10. A vertical semiconductor device, comprising:
    a plurality of vertical memory cells on an upper surface of a first substrate;
    a first insulating interlayer covering the vertical memory cells on the first substrate;
    an adhesive layer on a lower surface of the first substrate that is opposite to the upper surface of the first substrate;
    a second substrate having peripheral circuits thereon;
    a lower insulating interlayer covering the peripheral circuits on the second substrate, an upper surface of the lower insulating interlayer in contact with a lower surface of the adhesive layer;
    a plurality of through via contacts passing through at least the first insulating interlayer, each of the through via contacts in contact with a lower wiring of a corresponding one of the peripheral circuits; and
    a lower conductive layer between the first substrate and the adhesive layer, the lower conductive layer vertically and completely separating the first substrate from the adhesive layer,
    wherein the lower surface of the adhesive layer and the upper surface of the lower insulating interlayer serve as a bonding interface, and
    wherein voids are irregularly provided at the bonding interface.

11. The vertical semiconductor device of claim 10, wherein the first substrate includes a single crystal semiconductor material or polysilicon.

12. The vertical semiconductor device of claim 10, wherein the vertical memory cells comprises:
    first conductive patterns being apart from each other in a direction perpendicular to the first substrate; and
    channel structures passing through the first conductive patterns, the channel structures electrically connected to the first substrate.

13. The vertical semiconductor device of claim 12, wherein the through via contacts are not in direct contact with the vertical memory cells, and at least one of the through via contacts passes through the first conductive patterns.

14. A vertical semiconductor device, comprising:

a plurality of vertical memory cells on an upper surface of a first substrate;

an adhesive layer on a lower surface of the first substrate that is opposite to the upper surface of the first substrate;

peripheral circuits on a second substrate;

a lower insulating interlayer covering the peripheral circuits on the second substrate, an upper surface of the lower insulating interlayer in contact with a lower surface of the adhesive layer; and a lower conductive layer between the first substrate and the adhesive layer, the lower conductive layer vertically and completely separating the first substrate from the adhesive layer, wherein the lower surface of the adhesive layer and the upper surface of the lower insulating interlayer serve as a bonding interface, wherein voids are irregularly provided at the bonding interface, and wherein the first substrate overlaps an upper surface of the second substrate, and the adhesive layer and the lower insulating interlayer are between the first and second substrates.

15. The vertical semiconductor device of claim 14, further comprising:

a first insulating interlayer covering the vertical memory cells on the first substrate;

a plurality of through via contacts passing through at least the first insulating interlayer, the through via contacts in contact with a lower wiring of a corresponding one of the peripheral circuits; and an upper wiring electrically connected to the one of the through via contacts.

\* \* \* \* \*